(12) United States Patent
Chowdhury et al.

(10) Patent No.: US 11,988,728 B2
(45) Date of Patent: May 21, 2024

(54) NON-CONTACT LINEAR POSITION SENSOR WITH FLUX COLLECTORS AND A PLURALITY OF MAGNETS FOR MEASURING A CONTINUOUSLY INCREASING OR DECREASING MAGNETIC FIELD

(71) Applicant: HL MANDO CORPORATION, Gyeonggi-do (KR)

(72) Inventors: Mazharul Chowdhury, Midland, MI (US); Mohammad Islam, Saginaw, MI (US); Christian Ross, Bay City, MI (US)

(73) Assignee: HL MANDO CORPORATION, Gyeonggi-Do (KR)

( * ) Notice: Subject to any disclaimer, the term of this patent is extended or adjusted under 35 U.S.C. 154(b) by 0 days.

(21) Appl. No.: 17/401,235

(22) Filed: Aug. 12, 2021

(65) Prior Publication Data

US 2022/0034981 A1 Feb. 3, 2022

Related U.S. Application Data

(62) Division of application No. 16/276,491, filed on Feb. 14, 2019, now Pat. No. 11,163,024.

(60) Provisional application No. 62/653,515, filed on Apr. 5, 2018.

(51) Int. Cl.
*G01R 33/10* (2006.01)
*B62D 15/02* (2006.01)
*G01D 5/14* (2006.01)

(52) U.S. Cl.
CPC ........... *G01R 33/10* (2013.01); *B62D 15/021* (2013.01); *G01D 5/147* (2013.01)

(58) Field of Classification Search
CPC ...... B62D 15/021; G01D 5/147; G01D 5/145; G01R 33/10; G01R 33/072; G01R 33/091; G01R 33/34076; G01R 33/3614; G01R 33/3621; G01R 33/3657; G01R 33/3802

See application file for complete search history.

(56) References Cited

U.S. PATENT DOCUMENTS

| | | | |
|---|---|---|---|
| 4,185,265 | A | 1/1980 | Griffin et al. |
| 4,482,255 | A | 11/1984 | Gygax et al. |
| 4,853,604 | A | 8/1989 | McMullin et al. |
| 5,493,216 | A | 2/1996 | Asa |
| 5,663,641 | A | 9/1997 | Morita |

(Continued)

OTHER PUBLICATIONS

"Magnetic Materials: Soft Magnets", https://www.birmingham.ac.uk/Documents/college-eps/metallurgy/research/Magnetic-Materials-Background/Magnetic-Materials-Background-10-Soft-Magnets.pdf, accessed Oct. 15, 2018.

(Continued)

*Primary Examiner* — Jay Patidar
(74) *Attorney, Agent, or Firm* — Ladas & Parry, LLP

(57) ABSTRACT

Position sensors, including linear position sensors, that utilize magnetic field(s) are disclosed. Disclosed sensors include flux emitters and sensor assemblies. The sensor assemblies include flux collectors that interact with magnetic fields from flux emitters and with a magnetism sensing device. Flux emitters have arrangements of magnets that when combined with the sensor assembly can provide a constantly increasing or a constantly decreasing signal across a range of relative movement.

10 Claims, 13 Drawing Sheets

(56) References Cited

U.S. PATENT DOCUMENTS

| | | | | |
|---|---|---|---|---|
| 6,304,078 | B1* | 10/2001 | Jarrard | G01B 7/30 |
| | | | | 324/207.2 |
| 7,088,096 | B2 | 8/2006 | Etherington et al. | |
| 7,332,839 | B2 | 2/2008 | Jajtic et al. | |
| 8,405,391 | B2 | 3/2013 | Tenbrink et al. | |
| 8,803,513 | B2 | 8/2014 | Hosek et al. | |
| 2006/0012362 | A1 | 1/2006 | Gassman et al. | |
| 2008/0252285 | A1* | 10/2008 | Passwater | G01D 5/145 |
| | | | | 324/207.25 |
| 2008/0294344 | A1* | 11/2008 | Sugiura | E21B 47/024 |
| | | | | 324/207.13 |
| 2013/0057258 | A1 | 3/2013 | Frachon et al. | |
| 2020/0142010 | A1 | 5/2020 | Chowdhury et al. | |

OTHER PUBLICATIONS

Notice of Allowance dated Jul. 2, 2021 for U.S. Appl. No. 16/276,491 (now published as US. 2020/0142010).

Advisory Action dated Jun. 9, 2021 for U.S. Appl. No. 16/276,491 (now published as US. 2020/0142010).

Final Office Action dated Feb. 22, 2021 for U.S. Appl. No. 16/276,491 (now published as US. 2020/0142010).

Non-Final Office Action dated Aug. 17, 2020 for U.S. Appl. No. 16/276,491 (now published as U.S. 2020/0142010).

* cited by examiner

NON-CONTACT LINEAR POSITION SENSOR WITH FLUX COLLECTORS AND A PLURALITY OF MAGNETS FOR MEASURING A CONTINUOUSLY INCREASING OR DECREASING MAGNETIC FIELD

CROSS-REFERENCE TO RELATED APPLICATIONS

This application is a divisional of U.S. patent application Ser. No. 16/276,491 filed on Feb. 14, 2019, which claims the benefit of U.S. Provisional Application 62/653,515 filed on Apr. 5, 2018 and entitled "Non-Contact Linear Position Sensor", the disclosure of which is incorporated by reference in its entirety.

TECHNICAL FIELD

This disclosure relates to position sensors utilizing magnetic fields.

BACKGROUND

Position sensors can be used to detect the position of structures in space. In some embodiments, position sensors can detect the position along an arc. In some embodiments, position sensors can detect position along a line or in a plane. In some embodiments, it can be desirable for the position sensor to not impede the movement of the structure the position of which is being detected.

SUMMARY

In a first aspect disclosed herein, a non-contact linear position sensor is provided. The non-contact linear position sensor comprising: a sensor assembly comprising: a first magnetic flux collector having a distal and a proximal end; a second magnetic flux collector having a distal and a proximal end; and a magneto sensitive element positioned between and in operational communication with the respective proximal ends of the first and second magnetic flux collectors to measure the difference in magnetic fields that the first and second flux collectors are exposed to; a flux emitter comprising: a first magnetic region having a distal and a proximal end, wherein the distal and proximal ends extend between a north pole face and a south pole face of the first magnetic region; a second magnetic region; and a third magnetic region having a distal and a proximal end, wherein the distal and proximal ends extend between a north pole face and a south pole face of the third magnetic region; wherein the second magnetic region is positioned between the respective proximal ends of the first and the third magnetic regions and the second magnetic region has a pole direction opposite to the pole direction of the first magnetic region and opposite to the pole direction of the third magnetic region; and the sensor assembly is positioned to detect the magnetic field of the flux emitter in a spaced apart arrangement with the first and second flux collectors extending along the flux emitter, and in a zero position, the sensor assembly measures zero net magnetic field; and when the sensor assembly is moved relative to the flux emitter a first distance along the flux emitter in a direction of the first magnetic region, the sensor assembly detects a net positive magnetic field, and when the sensor assembly is moved relative to the flux emitter the first distance along the flux emitter in a direction of the third magnetic region, the sensor assembly detects a net negative magnetic field; and as the flux emitter is moved relative to the sensor assembly to a position where the distal end of the first flux collector corresponds to the distal end of the first magnetic region, the sensor assembly measures a continuously increasing net positive magnetic field, and as the flux emitter is moved relative to the sensor assembly to a position where the distal end of the second flux collector corresponds to the distal end of the third magnetic region, the sensor assembly measures a continuously decreasing net negative magnetic field.

In a second aspect disclosed herein, a non-contact linear position sensor is provided. The non-contact linear position sensor comprising: an flux emitter comprising a magnet array, the magnet array being mountable on a surface, the magnet array comprising: a first magnetic region comprising a first and a second subregion, each of the first and second subregions of the first magnetic region emitting a magnetic field, wherein the first and second subregions of the first magnetic region having respective distal and proximal ends extending between respective north and south poles and respective magnetic axes extending between the respective north and south poles, the magnetic axis of the first subregion of the first magnetic region being directed in a direction opposite to the magnetic axis of the second subregion of the first magnetic region, and the proximal ends of the first and second subregions of the first magnetic region being adjacent to one another; a second magnetic region comprising a first and a second subregion, each of the first and second subregions of the second magnetic region emitting a magnetic field, wherein the first and second subregions of the second magnetic region having respective distal and proximal ends extending between respective north and south poles and respective magnetic axes extending between the respective north and south poles, the magnetic axis of the first subregion of the second magnetic region being directed in a direction opposite to the magnetic axis of the second subregion of the second magnetic region, and the proximal ends of the first and second subregions of the second magnetic region being adjacent to one another; wherein, the magnetic axes of each of the first and second subregions of the first magnetic region and the first and second subregions of the second magnetic region extend outward from the surface when the magnet array is mounted on the surface for use; a sensor assembly comprising: a first magnetic flux collector; a second magnetic flux collector; and a magneto sensitive element positioned between and in operational communication with the first and the second magnetic flux collectors to measure the difference in magnetic fields that the first and second flux collectors are exposed to; wherein, when in operation, the first magnetic flux collector is positioned over the first magnetic region and the second flux collector is positioned over the second magnetic region, and as the distal end of the first subregion of the first magnetic region moves relative to the first flux collector toward the first flux collector, and the distal end of the first subregion of the second magnetic region moves relative to the second flux collector toward the second flux collector, the sensor assembly measures a continuously increasing or a continuously decreasing magnetic field.

In a third aspect disclosed herein, a non-contact linear position sensor is provided. The non-contact linear position sensor comprising: a flux emitter comprising a magnet array, the magnet array being mountable on a surface, the magnet array comprising: a first magnetic region comprising a first and a second subregion, wherein the first and second subregions of the first magnetic region having respective distal and proximal ends extending between respective north and south pole faces and respective magnetic axes extending between the respective north and south pole faces, the magnetic axis of the first subregion of the first magnetic region being directed in a direction opposite to the magnetic axis of the second subregion of the first magnetic region, and the proximal ends of the first and second subregions of the first magnetic region being adjacent to one another; wherein, the magnetic axes of each of the first and second subregions of the first magnetic region extend parallel to the surface when the magnet array is mounted on the surface for use; a sensor assembly comprising: a first magnetic flux collector; a second magnetic flux collector; and a magneto sensitive element positioned between and in operational communication with the first and the second magnetic flux collectors to measure the magnetic fields that the first and second flux collectors are exposed to; wherein, when in operation, the flux emitter moves relative to the first magnetic flux collector in a spaced apart manner with the north face of the first subregion and the south face of the second subregion moving relative to the second magnetic flux collector in a spaced apart manner with the south face of the first subregion and the north face of the second subregion of the first magnetic region, and as the distal end of the first magnetic region moves relative to the first and second flux collectors toward the first and second flux collectors, the sensor assembly measures a continuously increasing or a continuously decreasing magnetic field.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention. As used herein, the words proximal and distal are used to refer to relative locations, with proximal being used to identify locations close to a central area of a part or overall area (e.g. proximal end of a magnetic subregion is referenced in relation to a central area of the overall magnetic region or flux emitter) and with distal being used to identify locations distant or remote from the central area of a part or overall region (e.g. distal end of a magnetic subregion is referenced in relation to a central area of the overall magnetic region or flux emitter), with in some situations there being some exceptions to this general description, as indicated by the specific context. In this disclosure, where one part is described as moving relative to another, such as the flux emitter moving relative to the sensor assembly, in various embodiments, the one part can be moving while the other part is stationary, or the one part can be stationary while the other part is moving, or the one part and the other part can both be moving.

Single Row Emitter—Collectors Extending in Opposite Directions

Figure 1:
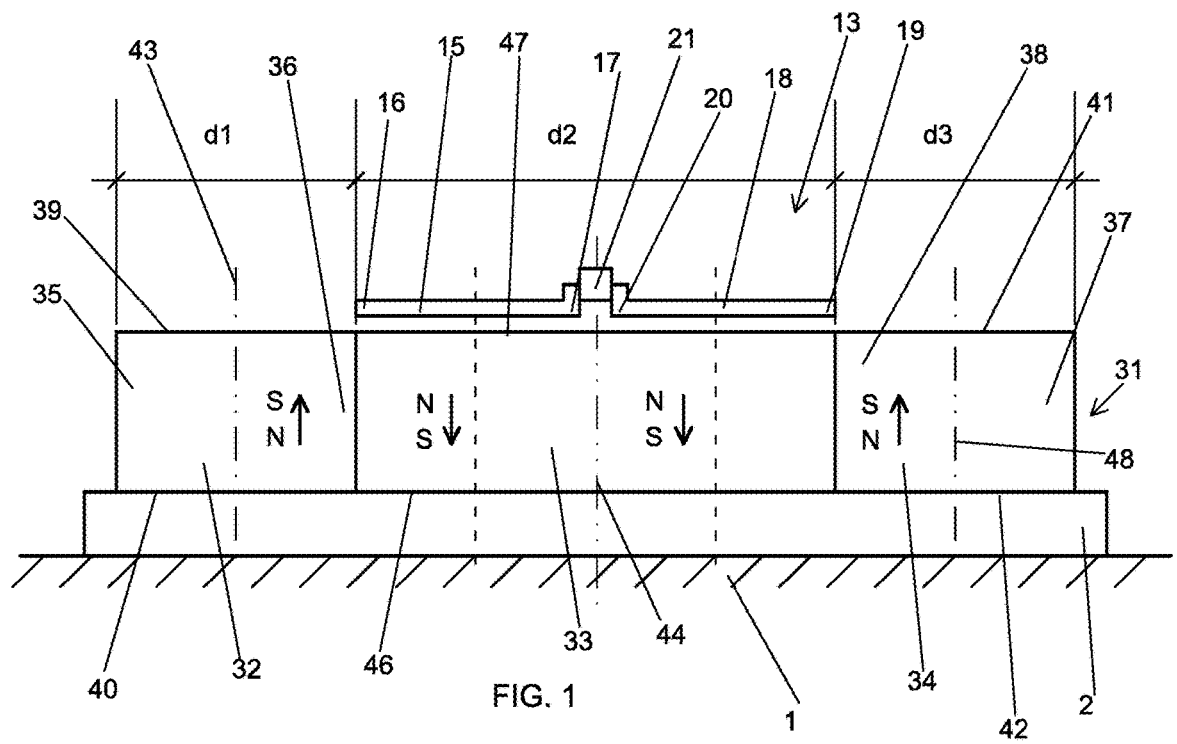
FIG. 1 shows an embodiment of a position sensor.

FIG. 1 shows an embodiment of a position sensor 11 having a flux emitter 31 comprising a single row of magnetic regions with a first magnetic region 32, a second magnetic region 33 and a third magnetic region 34. In various embodiments, the position sensor 11 can be linear, such as where flux emitter 31 is arranged linearly, or nonlinear. As shown in FIG. 1, the second magnetic region 33 can be positioned between the first magnetic region 32 and the third magnetic region 34.

The flux emitter 31 can be located directly on a surface 1, such as a surface which the relative position thereof is desired to be determined or monitored. In some embodiments, a base 2 can be located between the flux emitter 31 and surface 1.

The first magnetic region 32 has a north pole face 39, a south pole face 40, and a distal end 35 and a proximal end 36 extending between the north pole face 39 and south pole face 40 and a magnetic axis extending through the north pole face 39 and the south pole face 40. The second magnetic region has a magnetic axis 44 extending through the north pole face 46 and a south pole face 47. The third magnetic region 34 has a north pole face 41, a south pole face 42 and the distal end 37 and a proximal end 38 extending between the north pole face 41 and the south pole face 42 and a magnetic axis 48 extending through the north pole face 41 and the south pole face 42.

The second magnetic region 33 is positioned between the first magnetic region 32 and the third magnetic region 34 with the magnetic axis of the first magnetic region 43, the magnetic axis of the second magnetic region 44 and the magnetic axis of the third magnetic region 48 parallel to one another. However in some embodiments, at least one of the magnetic axis of the first magnetic region 43, the magnetic axis of the second magnetic region 44 and the magnetic axis of the third magnetic region 48 can vary from parallel to some extent, where such variation can result in some change or degradation in the performance of the sensor (such as a change in the slope of a response curve or a deviation from linearity or weakening/strengthening of the response signal.) In some embodiments, the proximal end of the first magnetic region 36 can contact a surface of the second magnetic region extending between the North magnetic surface 46 and the South magnetic surface 47 of the second magnetic region 33. In some embodiments, the proximal end of the third magnetic region 38 can contact the surface of the second magnetic region extending between the North magnetic surface 46 on the South magnetic surface 47 of the second magnetic region 33. In some embodiments, the second magnetic region 33 can be positioned and spaced apart from one or both of the first and third magnetic regions 32, 34.

A sensor assembly 13 can be positioned along the flux emitter 31, being configured and positioned to detect magnetic field(s) emitted by the flux emitter 31. In one embodiment, the sensor assembly 13 can comprise a first flux collector 15 extending in a first direction and a second flux collector 18 extending in a second direction opposite to the first direction. The sensor assembly 13 also comprises a magneto sensitive element 21 positioned between and is in functional communication with the first flux collector 15 and the second flux collector 18. In some embodiments, the proximal end of the first magnetic flux collector 17 and the proximal end of the second magnetic flux collector 20 can be attached to magneto sensitive element 21 or can be otherwise located adjacent to and in functional communication with magneto sensitive element 21.

In some embodiments, the sensor assembly 13 in a reference position can extend from the proximal end of the first magnetic region 36 to the proximal end of the third magnetic region 38, with the distal end of the first flux collector 16 coinciding with the proximal end of the first magnetic region 36 when the distal end of the second flux collector 19 coincides with the proximal end of the third magnetic region 38. However in some embodiments, the distal ends of the first and second flux collectors 16, 19 can extend somewhat past the proximal ends of the first and third magnetic regions 36, 38 or can extend to locations that do not quite reach the proximal ends of the first and third magnetic regions 36, 38. In the reference position, the first and second flux collectors 15, 18 are positioned primarily or completely over the second magnetic region 33.

Figure 2:
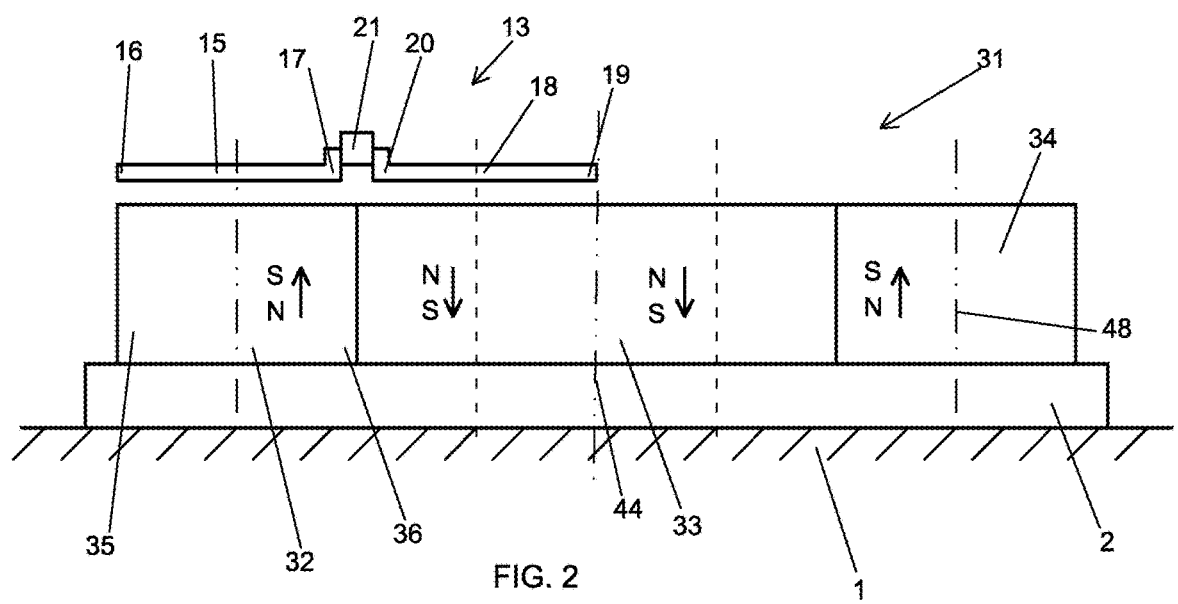
FIG. 2 shows an embodiment of a position sensor.

As flux emitter 31 and the sensor assembly 13 move in relation to one another (in various embodiments, the flux emitter 31 or the sensor assembly 13 can be stationary with the other moving, or both the flux emitter 31 and the sensor assembly 13 can move) from the reference position shown in FIG. 1 to a displaced position, such as that shown in FIG. 2, where the distal end of the first flux collector 16 corresponds to the distal end of the first magnetic region 35, the signal from the magneto sensitive element 21 can continuously increase or continuously decrease, such as with a linear signal where the rate of change of the signal divided by the change in position is a constant or approximately a constant. In some embodiments, as the sensor assembly 13 is moved relative to the flux emitter 31 such that the sensor assembly 13 is located at the opposite end of the flux emitter 31 where the distal end of the second flux collector 19 corresponds to the distal end of the third magnetic region 34, the signal from the magneto sensitive element 21 can continuously change in a direction opposite to that when the sensor assembly 13 is moved relative to the flux emitter 31 such that the distal end of the first flux collector 16 corresponds to the distal end of the first magnetic region 35, and the signal can continuously change such as with a linear signal where the rate of change of the signal divided by the change in position is a constant or approximately a constant. In some embodiments, when the sensor assembly 13 is in the reference position, the signal from the magneto sensitive element 21 is zero or approximately zero.

Figure 3:
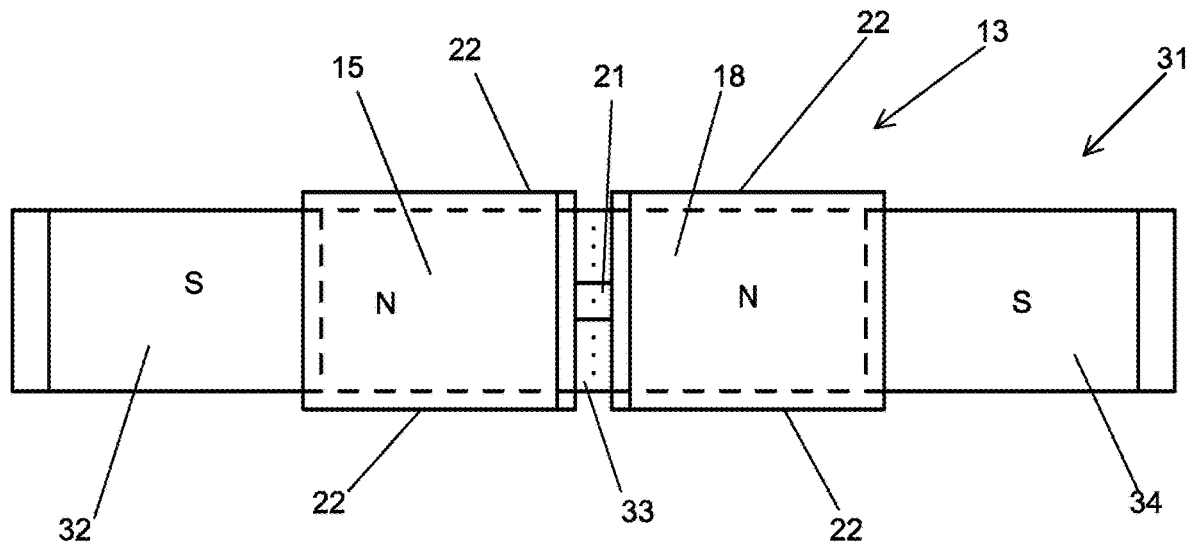
FIG. 3 shows an embodiment of a position sensor.

In some embodiments, the first flux collector 15 can have one or two edges 22 extending between the distal flux collector edges extending between the proximal end 17 and the distal and 16 which are located outboard of the edges of the South magnetic face of the second magnetic region 33, such as shown in FIG. 3. In some embodiments, the first flux collector can have one or two edges 22 that correspond to the edges of the South magnetic face of the second magnetic region or that are located inboard of the edges of the South magnetic face of the second magnetic region 33.

In some embodiments, the second flux collector 18 can have one or two edges 22 extending between the distal flux collector edges extending between the proximal end 20 and the distal and 19 which are located outboard of the edges of the South magnetic face of the second magnetic region 33, such as shown in FIG. 3. In some embodiments, the second flux collector can have one or two edges 22 that correspond to the edges of the South magnetic face of the second magnetic region or that are located inboard of the edges of the South magnetic face of the second magnetic region 33.

The magneto sensitive element 21 can be any suitable device that is able to convert a magnetic field carried by the flux collectors into an electrical signal, such as a current signal, a voltage signal, or a waveform or pulse signal. In some embodiments, the magneto sensitive element 21 can be a sensor that utilizes the Hall effect or magnetorestriction (MR), giant magnetoresistance (GMR), tunnel magnetoresistance (TMR), etc.

In use, a position sensor 11 such as that shown in FIG. 1 can have a flux emitter 31 be located on a first surface 1 or can be located on a base 2 which is attached to a surface 1, and the sensor assembly 13 can be mounted to or otherwise attached to a second surface (not shown) which moves in relation to surface 1. (The position sensors and flux emitters and sensor assemblies described elsewhere herein can also be located similarly.) As the first and second surfaces move in relation to one another, the sensor assembly 13 and the flux emitter 31 also move in relation to one another. In some embodiments, the position sensor 11 can be used in a steering system such as where one of the sensor assembly 13 and the flux emitter 31 is attached to a portion of the steering system which moves as the wheels are turned or as the steering wheel is turned or as a steering controller directs the wheels to turn and the other of the sensor assembly 13 in the flux emitter 31 is attached to a portion of the vehicle that is not a part of the steering system, such as a stationary portion of the vehicle or vehicle frame. In various embodiments, the flux emitter or the sensor assembly can be affixed to the steering rack housing assembly of a vehicle or other portion of the steering system of a vehicle that moves in relation to another part of the vehicle, with the other of the flux emitter and sensor assembly being affixed to a part close to the corresponding flux emitter or sensor assembly and in sensing communication thereof, where the sensor assembly and a flux emitter move in relation to one another as a steering command is provided or as the steering wheel is turned or as a wheel in contact with the road is moved to various turning positions to redirect the vehicle in any direction.

In some embodiments, the first magnetic region 32 can have a length (the distance between the proximal end 36 and distal end 35) equal to the amount of travel for which the position sensor 11 is configured for measuring travel in a first direction or the length of the first magnetic region 32 can be longer than the amount of travel for which the position sensor is configured for measuring travel in a first direction, and the third magnetic region 34 can have a length (the distance between the proximal end 38 and distal end 37) equal to or larger than the amount of travel for which the position sensor 11 is configured for measuring travel in a second direction. In some embodiments, the length of the first and third magnetic region can be equal or approximately equal. In some embodiments, the length of the second magnetic region 33 (the distance between the end of the second magnetic region adjacent to the proximal end of the first magnetic region 36 to the end of the second magnetic region adjacent to the proximal end of the third magnetic region 38) can be equal to the combined length of the first and third magnetic regions. In some embodiments, the length of the first magnetic flux collector can be equal to the length of the first magnetic region or the amount of travel for which the position sensor 11 is configured for measuring travel in the first direction, or the length of the first magnetic flux collector 15 and a distance between the proximal end of the first flux collector 17 and the proximal end of the second flux collector 20 can be equal to the length of the first magnetic region 32 or the amount of travel for which the position sensor 11 is configured for measuring travel in the first direction.

In some embodiments, the length of the second magnetic flux collector can be equal to the length of the third magnetic region or the amount of travel for which the position sensor 11 is configured for measuring travel in the second direction, or the length of the second magnetic flux collector 15 and a distance between the proximal end of the first flux collector 17 and the proximal end of the second flux collector 20 can be equal to the length of the third magnetic region 32 or the amount of travel for which the position sensor 11 is configured for measuring travel in the second direction. In some embodiments, the sum of the lengths of the first and second flux collector and the distance between the proximal ends of the first and second flux collectors can be equal to the length of the first and third magnetic regions or the amount of travel for which the position sensor 11 is configured for measuring travel in the first and second directions together.

In some embodiments, the second magnetic region can be formed from a single piece of magnet, such as where the magnetic poles are aligned. In some embodiments, the second magnetic region can be formed from a single piece of magnet. In some embodiments, the first magnetic region can be formed from a single piece of magnet or from a plurality of magnets. In some embodiments, the second magnetic region can be formed from a plurality of magnets. In some embodiments, the third magnetic region can be formed from a plurality of magnets. In some embodiments where a magnetic region is formed from a plurality of magnets, one or more pairs of adjacent magnets can contact each other or can be spaced apart from one another.

Dual Emitter Rows—Adjacent Collectors

Figure 4:
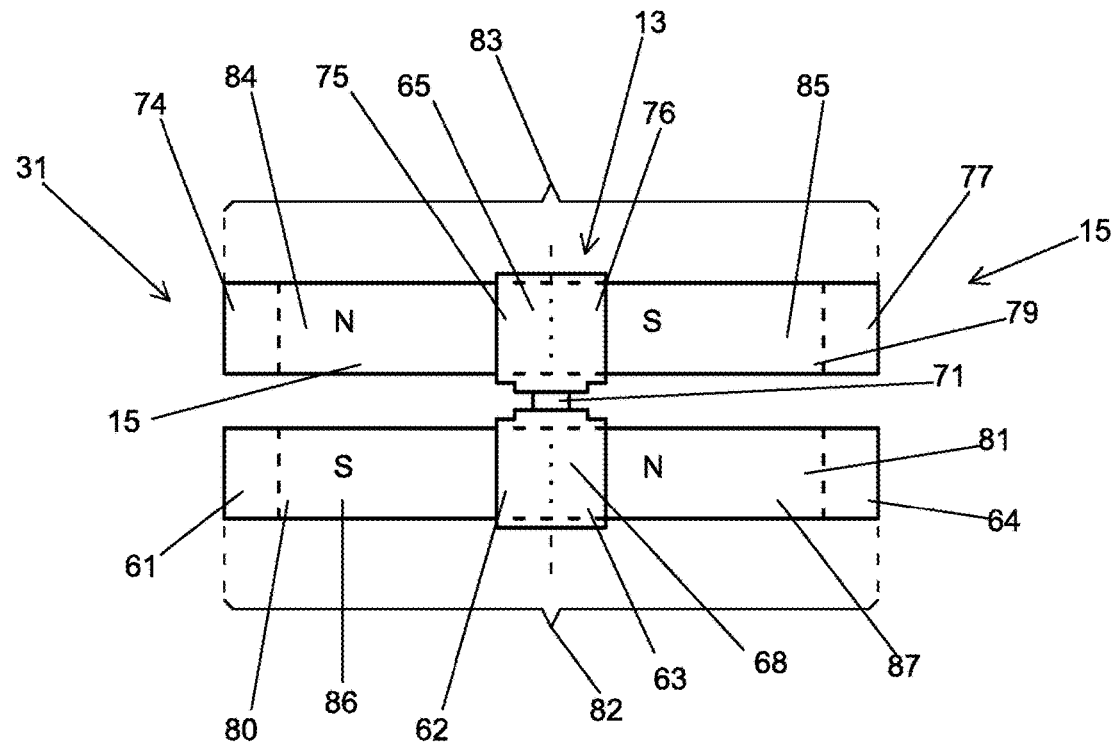
FIG. 4 shows an embodiment of a position sensor.
Figure 5:
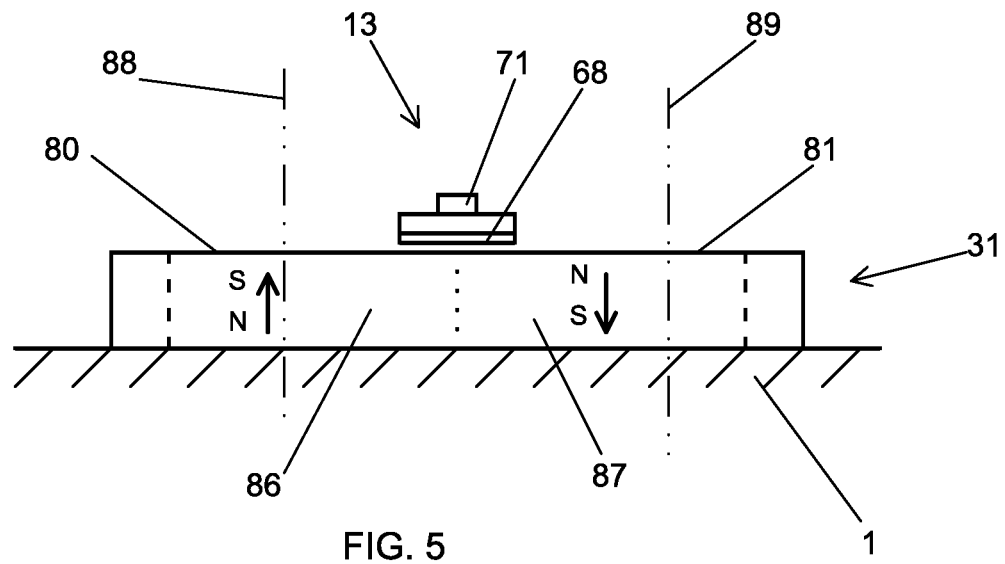
FIG. 5 shows an embodiment of a position sensor.
Figure 6:
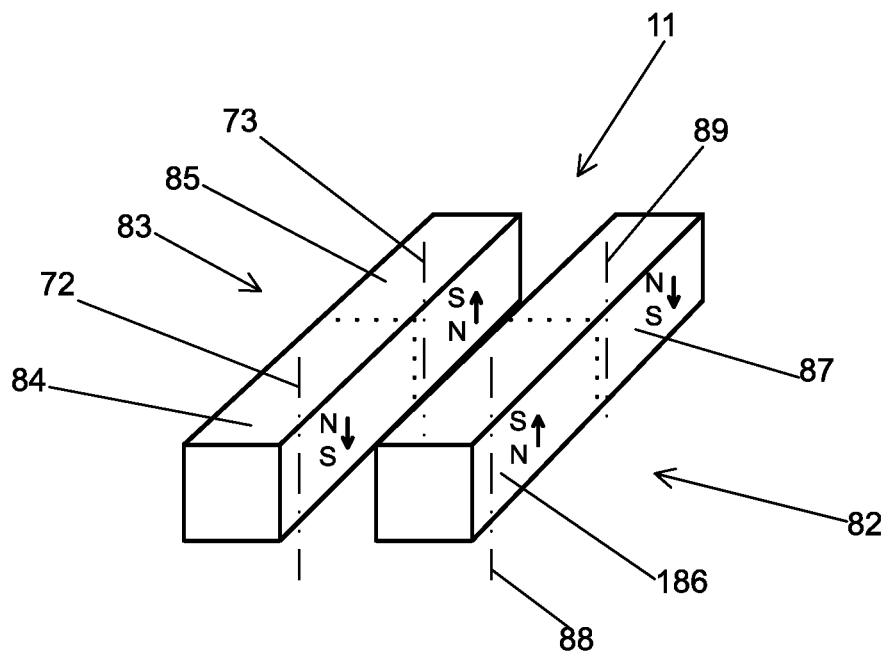
FIG. 6 shows an embodiment of a flux emitter of a position sensor.

FIGS. 4-6 show an embodiment of a position sensor 11 having a flux emitter 31 with a first magnetic region 83 and a second magnetic region 82. In various embodiments, position sensor 11 can be linear, such as where the flux emitter 31 is arranged linearly, or nonlinear. The first magnetic region 83 includes a first subregion 84 and a second subregion 85 where the first subregion 84 has a magnetic axis 72 directed in a direction opposite to the magnetic axis 73 of the second subregion 85.

The second magnetic region 82 has a first subregion 86 and a second magnetic subregion 87 where the first subregion 86 has a magnetic axis 88 directed in a direction opposite to the magnetic axis 89 of the second subregion 87.

As shown in FIG. 4, a sensor assembly 13 can be configured and positioned to detect magnetic field(s) emitted by the flux emitter 31. In one embodiment, the sensor assembly can comprise a first flux collector 65 extending over the first magnetic region 83 in a spaced apart relationship with the first magnetic region 83. The first flux collector can be moved over or along the first magnetic region 83 (or vice versa) for the first flux collector to interact with the first subregion 78 and the second subregion 79 of the first magnetic region 83.

In some embodiments, a second flux collector 68 can extend over the second magnetic region 82 in a spaced apart relationship with the second magnetic region 82. The second flux collector can be moved over or along the second magnetic region 82 (or vice versa) for the second flux collector to interact with the first subregion 86 and the second subregion 87 of the second magnetic region 82.

In various embodiments, a magneto sensitive element 71 can be positioned in functional communication with the first flux collector 65 and/or the second flux collector 68. In some embodiments, a magneto sensitive element 71 can be positioned directly in contact with first flux collector 65 and/or the second flux collector 68. In some embodiments, a magneto sensitive element 71 can be positioned between the first flux collector 65 and the second flux collector 68.

The first flux collector 65 and/or the second flux collector 68 can be any appropriate size and any appropriate shape to functionally interact with the magnetic field emitted from the flux emitter and to functionally interact with a magneto sensitive element to generate a signal related to the magnetic field strength or difference in magnetic field strength, such as where the first and/or second flux collector 65, 63 extends along a length of the respective first and/or second magnetic region 83, 82 (such as extending along at least a portion of the length between the distal end of the first subregion of the respective magnetic region and a distal end of the second subregion of the respective magnetic region) and along at least a portion of the width of the respective magnetic region (such as where the first and/or second flux collector 65, 63 extends from one edge of the respective magnetic region 83, 82 to the opposite edge of the respective magnetic region 83, 82 along at least a portion of the length of the respective magnetic region 83, 82 or by allowing one or both of the edges of the respective magnetic region to be exposed or by extending beyond one or both edges of the respective magnetic region 83, 82, or some combination thereof.)

Figure 7:
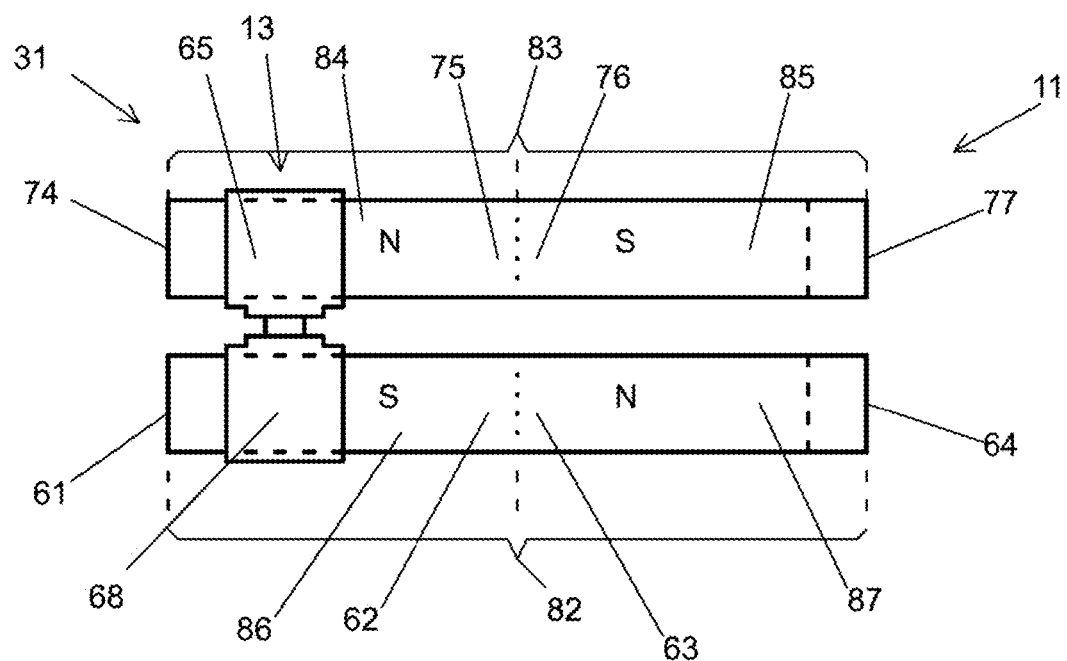
FIG. 7 shows an embodiment of a position sensor.

In some embodiments, the flux emitter 31 can move in relation to the first and/or second flux collector such that the first and/or second flux collector can be positioned at any point along the entire length of the respective first and/or second magnetic region 83, 82 or the flux emitter 31 can move in relation to the first and/or second flux collector such that the first and/or second flux collector can be positioned at any point along only a portion of the respective first and/or second magnetic region 83, 82. FIG. 7 shows an embodiment of a position sensor 11 wherein relative movement has positioned the sensor assembly 13 near to, but not at the distal ends 74, 61 of first subregion 84, 86 of first and second magnetic regions 83, 82.

In some embodiments, the first subregion 84 of the first magnetic region 83 can have a length (the distance between the distal end 74 and proximal end 75) and/or the first subregion 86 of the second magnetic region 82 can have a length (the distance between the distal end 61 and proximal end 62) equal to, greater than or less than, each subregion length determined independently, the amount of travel for which the position sensor 11 is configured for measuring travel in a first direction.

In some embodiments, the second subregion 85 of the first magnetic region 83 can have a length (the distance between the distal end 77 and proximal end 76) and/or the second subregion 87 of the second magnetic region 82 can have a length (the distance between the distal end 77 and proximal end 76) equal to, greater than or less than, each subregion length determined independently, the amount of travel for which the position sensor 11 is configured for measuring travel in a second direction, second direction being different, such as opposite to, the first direction.

In some embodiments, each of the first and second magnetic region 83, 82 can be made from an individual magnet (a single piece magnet). In some embodiments, at least one of the subregions of the first and second magnetic regions 83, 82 can be made from a single piece of magnet, such as where the first subregion 84 of the first magnetic region 83 is a single piece of magnet, the second subregion 85 of the first magnetic region 83 is a single piece of magnet, the first subregion 86 of the second magnetic region 82 is a single piece of magnet and the second subregion 87 of the second magnetic region 82 is a single piece of magnet. In some embodiments, at least one of the subregions of the first and second magnetic region 83, 82 can be formed from a plurality of discrete magnets. (As used herein, when a series or plurality of discrete or separate magnets are described, except when indicated otherwise by the context, the individual magnets can be separated by a gap, can be affixed to one another or can separated by a non-magnetic material, such as plastic, ceramic, adhesive, non-magnetic metal.) In some embodiments, both of the subregions of one or both of the first and second magnetic regions can be formed from a plurality of magnets. In some embodiments, all of the subregions of the first and second magnetic regions 83, 82 can be formed from a plurality of magnets. In some embodiments where a plurality of magnets are used in a subregion, two or more of the individual magnets within the subregion can be in contact with another magnet. In some embodiments were plurality of magnets are used in a subregion, two or more of the individual magnets within the subregion can be spaced apart from another adjacent magnet. In some embodiments where a plurality of magnets are used in a subregion, all of the individual magnets can be positioned to contact another magnet or can be positioned to be spaced apart from all adjacent magnets.

In some embodiments, the magnetic field strength of one or more or all of the subregions can vary along the length of the individual subregion. In some embodiments, the magnetic field strength, such as that measured by the sensor portion, can continuously increase or continuously decrease as the sensor portion moves relative to the flux emitter from a proximal end to a distal end (or a region near the distal end of the subregion or a location near the distal end of the subregion that corresponds to the maximum extent of travel to be measured along the subregion). In some embodiments, the continuous increase in measured field strength can be linear. In some embodiments, as the sensor portion 13 moves relative to the flux emitter 31 from a central region along the flux emitter 31 in a first direction, the magnetic field strength measured will continually increase or decrease, such as in a linear fashion, and as the sensor portion 13 moves relative to the flux emitter 31 from the central region along the flux emitter in a second direction, the magnetic field strength measured will continually decrease or increase, such as in a linear fashion, resulting in the relative movement of the sensor assembly from one distal end to the other distal end providing a continually increasing or continually decreasing measurement of magnetic field. The strength of the magnetic field can be varied in any applicable manner, such as by varying the size or a dimension of the individual magnets, changing the type of the individual magnets (of any suitable material, e.g. alnico, ferrite, flexible rubber, or rare earth such as samarium, cobalt and neodymium, etc.), by changing the spacing between the magnet and the sensor or flux collector or by varying the direction of the poles of the individual magnets.

Figure 8A:
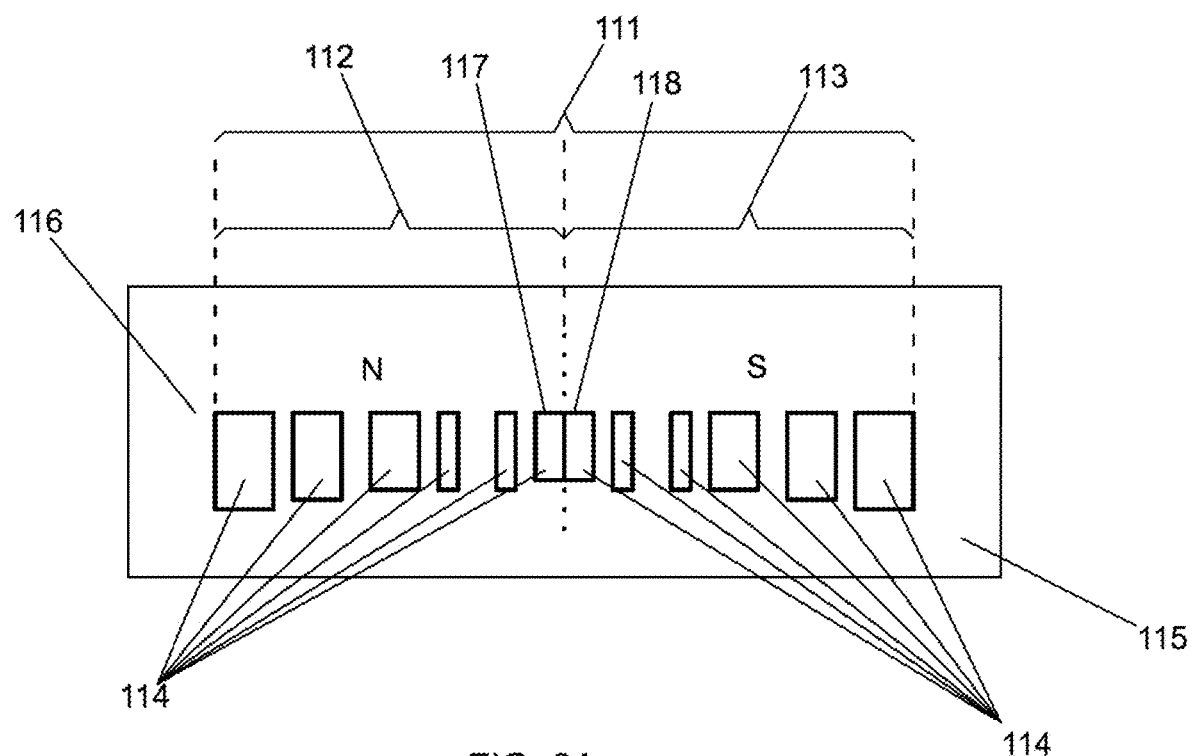
FIG. 8A shows an embodiment of a flux emitter of a position sensor.

FIG. 8A shows an embodiment of a magnetic region 111 where individual magnets 114 are separated from adjacent magnets and the individual magnets 114 vary in size along the length of a subregion 112, 113. In FIG. 8A, larger magnets are shown closer to the distal end 115, 116 and smaller magnets are shown closer to the proximal end 117, 118 of the subregions 112, 113 shown. FIG. 8A also shows an embodiment where the proximal ends 117, 118 of the subregions contact one another, but alternate embodiments can have the proximal ends 117, 118 of the subregions spaced apart from one another. In some embodiments, magnets of different materials that are stronger or weaker due to the materials used can also be used either with or in place of the different sizes of magnets. In addition, FIG. 8A shows an embodiment where one edge of the individual magnets 114 in the flux emitter are aligned, with the opposite edge not being aligned due to the varying width of the individual magnets 114, however in some embodiments, the individual magnets 114 can be positioned such that the individual magnets 114 can be located such that neither edge has all of the magnets 114 aligned with one another or only some, but not all, of the magnets 114 aligned with one another, such as where the individual magnets 114 are aligned along a common axis running through the individual pieces of magnet, such as at a centerline or as an axis of symmetry.

Single Row Emitter, Lateral Positioning

Figure 9:
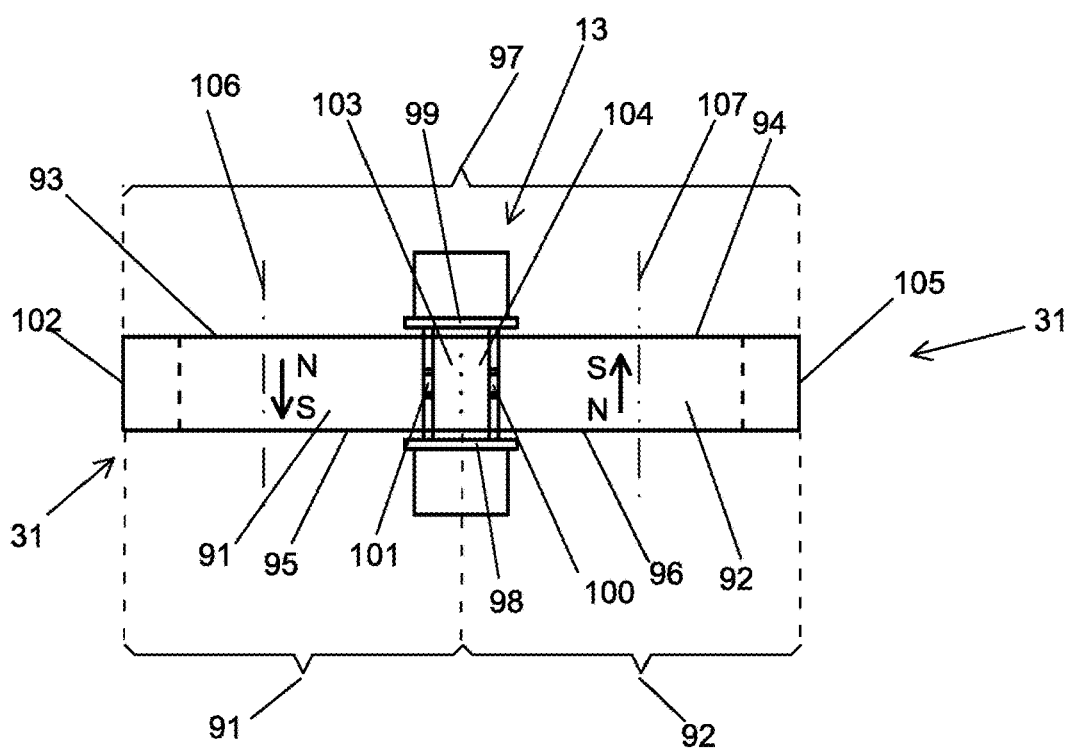
FIG. 9 shows an embodiment of a position sensor.
Figure 10:
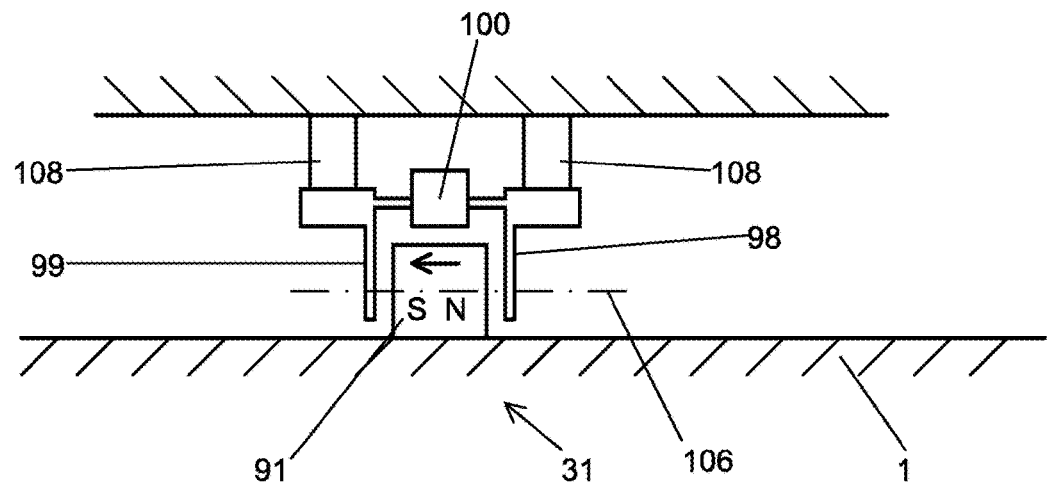
FIG. 10 shows an embodiment of a position sensor.

FIG. 9 shows an embodiment of a position sensor 11 having a flux emitter 31 with a magnetic region 97 having a first subregion 91 and a second subregion 92, wherein the first and second subregions 91, 92 have respective magnetic axes 106, 107 directed in opposite directions. In various embodiments, position sensor 11 can be linear, such as where the flux emitter 31 is arranged linearly, or nonlinear. In addition, as shown in FIG. 10, an end view of the device shown in FIG. 9, the magnetic axes 106, 107 of the first and second subregions 91, 92 are directed parallel or substantially parallel to the surface 1 (or in some embodiments to a tangent to surface 1) which the flux emitter 31 is attached to. In some embodiments, magnetic axes 106, 107 can be oriented parallel to the surface 1. In some embodiments, magnetic axes 106, 107 can be oriented off parallel to surface 1. In addition, a base or other structure (not shown) can be located between the flux emitter 31 and the surface 1.

Also shown in FIGS. 9 and 10 first flux collector 99 is shown as corresponding to the North Pole face of the first subregion 93 and the South Pole face of the second subregion 94 and the second flux collector 98 is shown as corresponding to the South Pole face of the first subregion 95 and the North Pole face of the second subregion 96. The sensor assembly 13 and its first and second flux collectors are spaced apart and in operational communication with the flux emitter 31 to detect magnetic fields emitted from flux emitter 31. A magneto sensitive element 100 or pair of magneto sensitive elements 100, 101 are in operational communication with the first and second flux collectors 99, 98. In some embodiments, a magneto sensitive element 100 or pair of magneto sensitive elements 100, 101 can be positioned between the first and second flux collectors 99, 98 and above the flux emitter 31, as shown in FIG. 10.

The first flux collector 99 and/or the second flux collector 98 can be any appropriate size and any appropriate shape to functionally interact with the magnetic field emitted from the flux emitter into functionally interact with the magneto sensitive element to generate a signal related to the magnetic field strength, such as where the first and/or second flux collectors 99, 98 extend along a length of the pole faces of the flux emitter.

In some embodiments, the first and/or second flux collectors 99, 98 can move relative to the flux emitter 31 along the entire length of the flux emitter 31 or along only a portion of the flux emitter 31. In some embodiments, the first and/or second flux collectors 99, 98 can move relative to the first subregion 91 along a portion of the first subregion 91 equal to the amount of travel for which the position sensor 11 is configured for measuring travel in a first direction. In some embodiments, the amount of travel in a first direction can be equal to the length of the first subregion (the distance between the distal end 102 and a proximal end 103 of the first subregion) or it can be less than the length of the first subregion. In some embodiments, the amount of travel in a first direction can be longer than the length of the first subregion.

In some embodiments, the first and/or second flux collectors 99, 98 can move relative to the second subregion 92 along a portion of the second subregion 92 equal to the amount of travel for which the position sensor 11 is configured for measuring travel in a second direction (the second direction being different, such as opposite to, the first direction.) In some embodiments, the amount of travel in a first direction can be equal to the length of the second subregion (the distance between the distal end 105 and a proximal end 104 of the second subregion) or it can be less than the length of the second subregion. In some embodiments, the amount of travel in a second direction can be longer than the length of the second subregion.

In some embodiments, magnetic region 97 can be made from an individual magnet. In some embodiments, at least one of the subregions 91, 92 can be made from a single piece of magnet such as where the first subregion 91 is a single piece of magnet and the second subregion 92 is a separate single piece of magnet. In some embodiments, at least one of the first and second subregions 91, 92 can be formed from a plurality of magnets. In some embodiments, both the first and second subregions 91, 92 can be formed from a plurality of magnets. In some embodiments where a plurality of magnets are used in a subregion, two or more of the individual magnets within the subregion can be in contact with another magnet. In some embodiments where a plurality of magnets are used in a subregion two or more of the individual magnets within the subregion can be spaced apart from an adjacent magnet. In some embodiments where a plurality of magnets is used in a subregion all of the individual magnets can be positioned to contact another magnet or can be positioned to be spaced apart from all adjacent magnets.

In some embodiments, the magnetic field strength of one or more or all of the subregions can vary along the length of the individual subregion. In some embodiments, the magnetic field strength, such as that measured by the sensor portion, can continuously increase or decrease as the sensor portion moves relative to the flux emitter from a proximal end to a distal end of the flux emitter (or a region near the distal end of the subregion or a location near the distal end of the subregion that corresponds to the maximum extent of travel to be measured along the subregion). In some embodiments, the continuous increase in measured field strength can be linear.

In some embodiments, as the sensor portion 13 moves relative to the flux emitter 31 from a central region along the flux emitter 31 in a first direction, the magnetic field strength measured will continually increase or decrease, such as in a linear fashion, and as the sensor portion 13 moves relative to the flux emitter 31 from the central region along the flux emitter in a second direction, the magnetic field strength measured will continually decrease or increase, such as in a linear fashion, resulting in the relative movement of the sensor assembly from one distal end to the other distal end providing a continually increasing or continually decreasing measurement of magnetic field.

The strength of the magnetic field can be varied in any applicable manner, such as by varying the size (such as by changing one or more dimension, such as length, width or height, or any combination of these, of a magnet or a portion of a magnet, where length is a dimension along the direction of the position that is being determined, width is a dimension perpendicular to length and parallel to the surface the flux emitter or the magnet is affixed to and height is a dimension perpendicular to length and width) of one or more of the individual magnets, changing the type of the individual magnets (of any suitable material, e.g. alnico, ferrite, flexible rubber, or rare earth such as samarium, cobalt and neodymium, etc.), or by changing the spacing between the magnet and the sensor or flux collector.

Figure 8B:
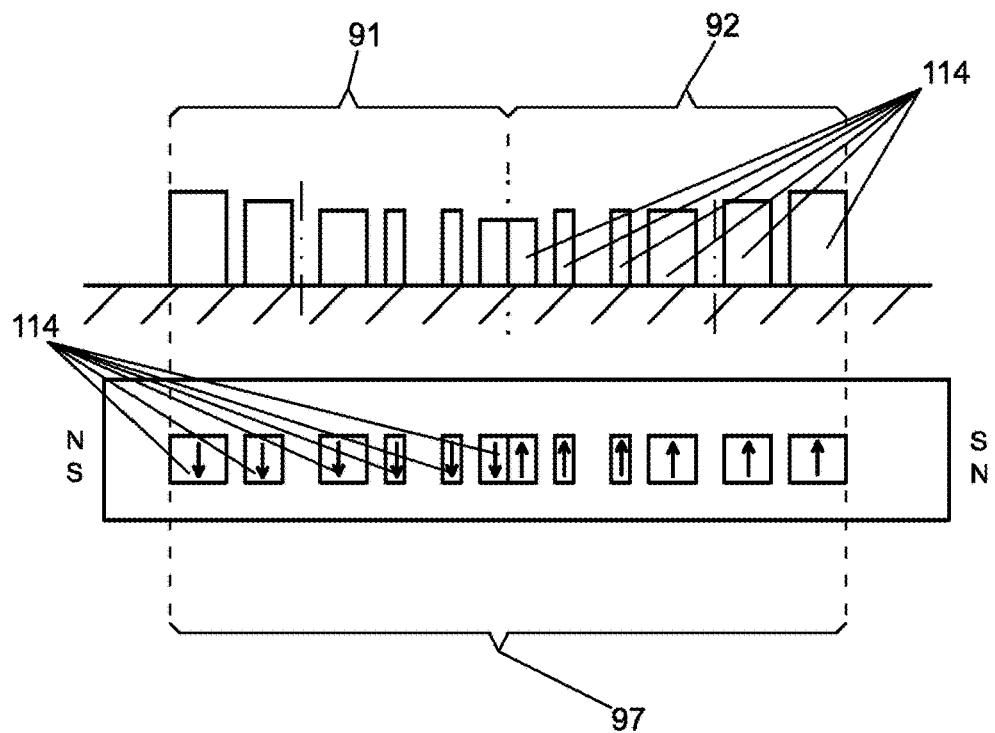
FIG. 8B shows an embodiment of a flux emitter of a position sensor.

FIG. 8B shows an embodiment of a magnetic region where at least some individual magnets 114 are separated from adjacent magnets and the individual magnets 114 vary in size along the length of a subregion. (The individual magnets of FIG. 8B shows individual magnets with different heights and lengths.) In FIG. 8B, larger magnets are shown closer to the distal end and smaller magnets are shown closer to the proximal end of the subregions shown. FIG. 8B also shows an embodiment where the proximal ends of the subregions contact one another, but alternate embodiments can have the proximal ends of the subregions spaced apart from one another. In some embodiments, magnets of different materials that are stronger or weaker due to the materials used can also be used either with or in place of the different sizes of magnets. In one embodiment of the flux emitter shown in FIG. 8B, the two outermost individual magnets in each subregion (the two most distal within each subregion can be of a different material than the other magnets, such as using stronger magnets for these outermost magnets. In one such embodiment, the two outermost magnets in each subregion can be 0.4T sintered ferrite while the rest can be 0.2T injection molded ferrite. In another embodiment, the two outermost magnets in each subregion can be 0.3T injection molded ferrite while the other magnets can be 0.15T injection molded ferrite. In a general embodiment, the strength of the outermost magnets can be a multiple of the strength of the other magnets, such as where the multiple is 1.2-1.4, 1.4-1.6, 1.6-1.8, 1.8-2, 2-2.2, 2.2-2.4, 2.4-2.8, 2.8-3, 3-3.5, 3.5-4 or greater than 4.

One advantageous feature of the position sensor shown in FIGS. 9 and 10 is a reduced sensitivity of the sensor output due to variations in the positioning of the flux emitter 31 in relation to the sensor assembly 13. For example, if the second flux collector 98 is positioned closer to the flux emitter 31 while the first flux collector 99 is positioned further away from the flux emitter 31, such as during assembly of the position sensor into an automobile or other application, with the flux emitter being affixed to one piece of structure and the sensor assembly being affixed to a different piece of structure, when the first and second piece of structure move in relation to one another, the signal strength associated with the second flux collector will increase and the signal strength associated with the first flux collector will decrease, but in the output by the magneto sensitive element, these differences will at least partially or fully cancel each other out.

In some embodiments of all of the position sensors disclosed herein, it can be advantageous to configure the flux emitter and sensor assembly such that in a central position of the sensor assembly in relation to the flux emitter, the output is zero or near zero, and when the sensor assembly is moved in relation to the flux emitter in either direction the signal output of the sensor assembly continually increases (one direction) or continually decreases (second direction), such as in a linear fashion. In some embodiments, the absolute value of the rate of change in signal in one direction can be different from the absolute value of the rate of change in the second direction, such as where absolute value of the slope of the output in the first direction is different from the absolute value of the slope in the second direction. In some embodiments, including those with sensing output described as continually increasing or continually decreasing, in the vicinity of some portion, such as at or in the vicinity of the central position, the rate of change of the output can decrease and/or approach zero.

Figure 14:
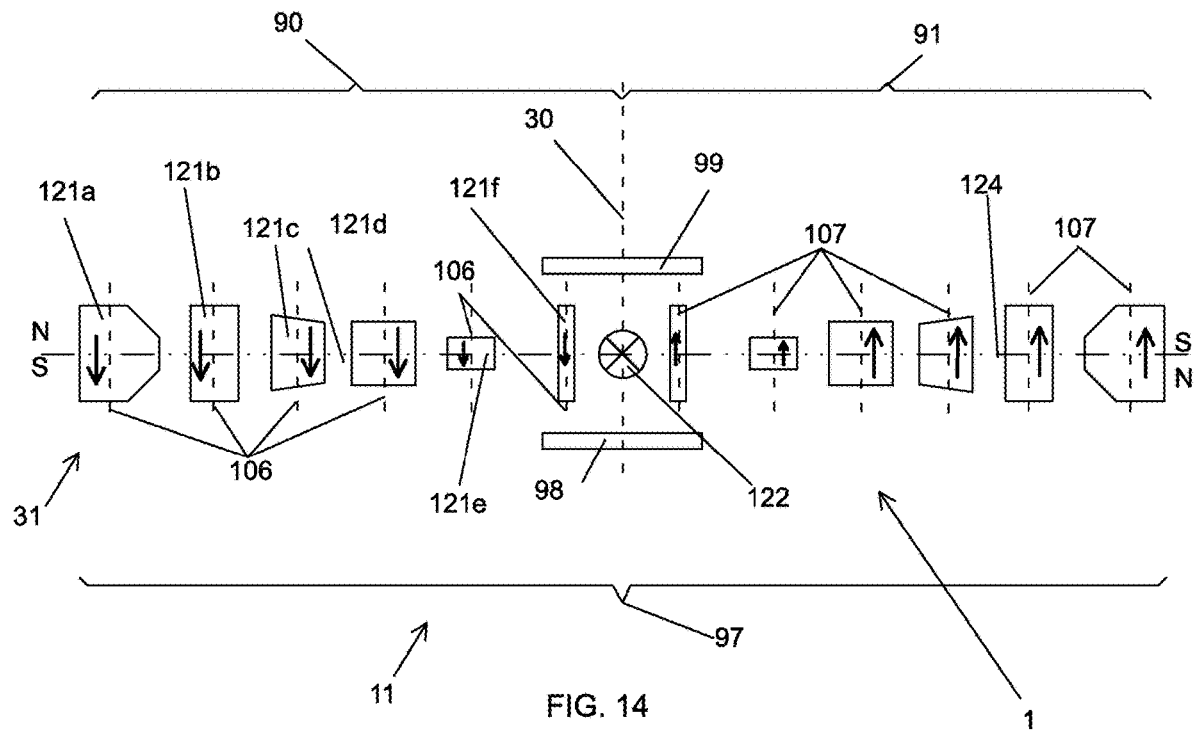
FIG. 14 shows an embodiment of an flux emitter with an embodiment of flux collectors from an embodiment of a sensor assembly also shown.
Figure 16:
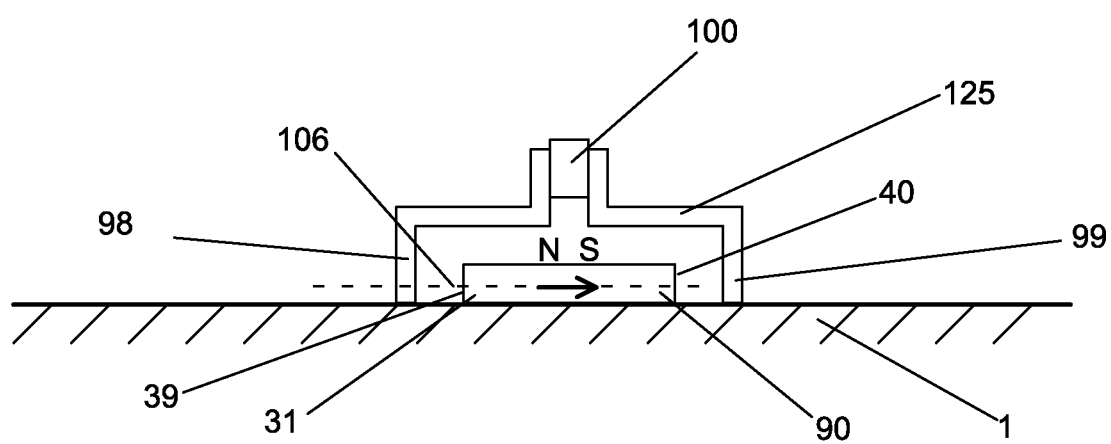
FIG. 16 shows an embodiment of a sensor assembly that also shows an embodiment of a flux emitter.

FIG. 14 shows an embodiment of a position sensor 11 having a flux emitter 31 with a magnetic region 97 having a first subregion 91 and a second subregion 92, wherein the first and second subregions 91, 92 have respective magnetic axes 106, 107 directed in opposite directions. In some embodiments, there can be an axis 122 of symmetry 30 between the first and second subregions 91, 92, except that the direction of the magnetic axes 106, 107 (and magnetic pole direction) is reversed. (In some embodiments, each flux collector can have an axis of symmetry, and when the flux collectors are in the zero position, the flux collector axis of symmetry can coincide with axis of symmetry 30.) In various embodiments, position sensor 11 can be linear, such as where the flux emitter 31 is arranged linearly, or nonlinear. In addition, as shown in FIGS. 14 and 16, the magnetic axes 106, 107 of the first and second subregions 91, 92 can be directed along the surface 1 which the flux emitter 31 is attached to. In some embodiments, magnetic axes 106, 107 can be oriented parallel to the surface 1. In some embodiments, magnetic axes 106, 107 can be oriented off parallel to surface 1. In addition, a base or other structure (not shown) can be located between the flux emitter 31 and the surface 1. In various embodiments, the magnetic axes for individual magnets can be oriented parallel to one another or off parallel to one another.

Figure 15:
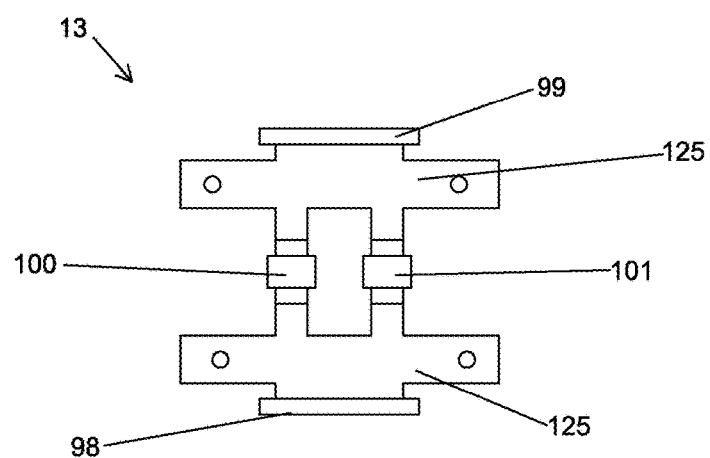
FIG. 15 shows an embodiment of a sensor assembly.

In some embodiments of the flux emitter and position sensor of FIG. 14, can be used with a sensor assembly 13, such as embodiment of a sensor assembly 13 as shown in FIG. 15. In FIG. 15, flux collectors 99, 98 are functionally connected to magneto sensitive elements 100, 101 through brackets 125. As shown in FIG. 16, flux collectors 98, 99 can be located such that the flux emitter 31 is located at least partially between flux collector 98 and flux collector 99, with the flux collectors 98, 99 movable along the North pole face 39 and South pole face 40 of the individual magnets that make up the flux emitter 31.

Flux Collector Shapes

In various embodiments of position sensors disclosed herein, one or more of the flux collectors can be any suitable size and shape that is able to interact with a magnetic field of an associated flux emitter to modify the magnetic field created by the flux emitter 31 and work in concert with the magneto sensitive element 21, 71, 100, 101 to generate a signal related to the position of the sensor portion 13 in relation to the flux emitter 31.

Figure 11:
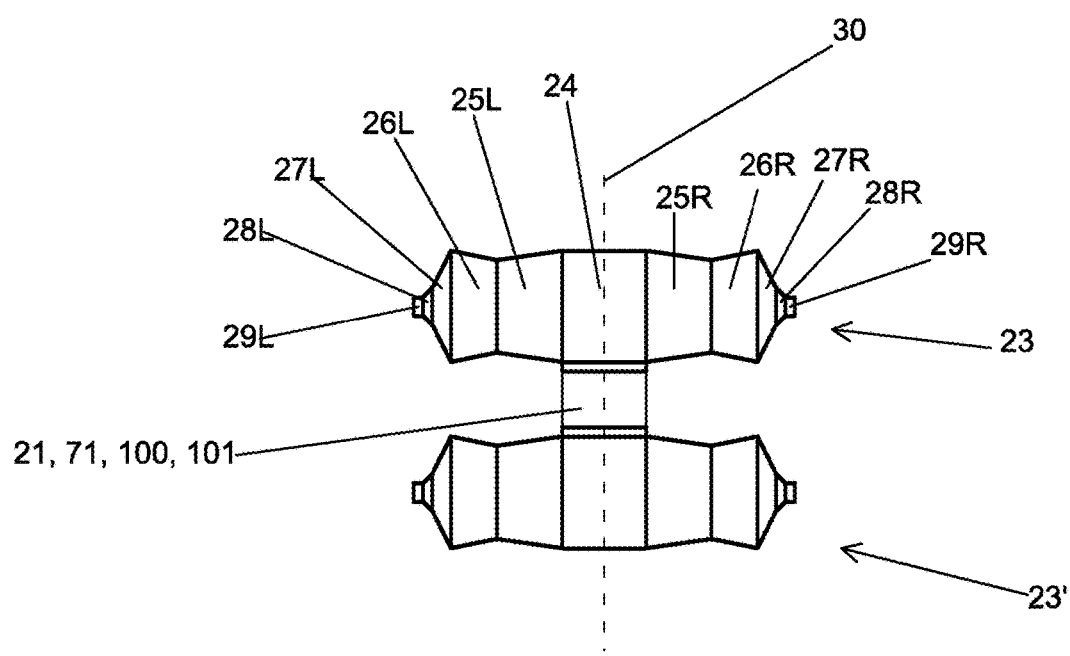
FIG. 11 shows an embodiment of a sensor portion with flux collectors.

In some embodiments, one or both of the flux collectors 23, 23' can be in the shape of a square, rectangle, triangle, rhombus, parallelogram, circle, oval, rounded shape, tapered shape or combination thereof (One such embodiment is shown in FIG. 11.) In some embodiments, the first flux collector 23 can have the same shape as the second flux collector 23, 23'. In some embodiments, the first flux collector 23 can have a shape that is similar but different size than the second flux collector 23', and vice versa. In some embodiments, the first flux collector 23 can have a different shape from the second flux collector 23'. In various embodiments, a flux collector 23 can be connected to the magneto sensitive element 21, 71, 100, 101 at a location central to the flux collector, such as in the center of the flux collector or at a location displaced from the center. In some embodiments, a flux collector can be attached to a magneto sensitive element 21, 71, 100, 101 by way of a tab, a flange, bracket or some other intervening part or set of intervening parts. In some embodiments, a flux collector can be made of any material suitable for carrying magnetic flux, such as a ferromagnetic material and preferably soft magnetic materials. In some embodiments, the flux collector and the tab, flange, bracket or other intervening part that attaches the flux collector to the magneto sensitive element 21, 71, 100, 101 can be the same material or different material, such as both being ferromagnetic materials (the same or different) or just one being a ferromagnetic material. In some embodiments, the first flux collector and the second flux collector can be the same material or a different material. In various embodiments, suitable materials can include magnetic materials, with soft magnetic materials being preferred and suitable materials including iron-silicon alloys, silicon steel, amorphous nano-crystalline alloys, nickel-iron alloys, soft ferrites (e.g. $MO \cdot Fe_2O_3$, where M is a transition metal such as nickel, manganese or zinc; MnZn ferrite; microwave ferrites such as yttrium iron garnet, etc.; and the like), and other materials having the ability to carry magnetic flux. In some embodiments, the material of the flux collector and the size and shape of the flux collector can be chosen to provide desirable values for magnetic permeability, generally with higher values being preferred, and with some embodiments having about 500-1000, or about $10^3$-$10^4$, or about $10^4$-$10^5$, or about $10^5$-$10^6$ H/m or higher.

In some embodiments, a flux collector can comprise a restriction in the magnetic circuit for the magnetic flux flowing through the flux collector. Suitable restrictions can include reductions in cross-sectional area such as a narrowing of the width of the flux collector or a thinning of the flux collector. In some embodiments, in operation, such restrictions can reduce the change in slope of the response curve, especially when used with segmented magnets or magnets of varying strength, and such restrictions can make the response curve more linear when compared to a flux collector without restrictions. In some preferred embodiments, a restriction can occur at one or both ends of a flux collector, such as that shown in FIG. 11 as elements 29L and 29R. In some embodiments, one or both of the flux collectors 23 can have a shape such as that shown in FIG. 11, with a rectangular central portion 24 attached to left and right tapering portions 25L, 25R which narrow as low distance from the central portion 24 increases, which are attached to outward tapering portions 26L, 26R which increase in with as the distance from the left and right tapering portions 25L, 25R (or the central portion 24) increase, which are attached to left and right secondary tapered sections 27L, 27R which narrow in width as the distance from the outward tapering portions 26L, 26R (or the central portion 24) increase, which are attached to left and right tertiary tapered sections 28L, 28R which narrow and with as the distance from the secondary tapered sections 27L, 27R (or the central portion 24) increase, which are attached to flux collector tips 29L, 29R having a rectangular or square shape. In some embodiments, one or more of the sections can be left out such as the left or right tapered sections 25L, 25R and/or left or right outwardly tapered sections 26L, 26R and/or left or right secondary tapered sections 27L, 27R and/or left or right tertiary tapered sections 28L, 28R and/or left or right flux collector tips 29L, 29R.

In various embodiments, the first and/or second flux collector 23 can have an axis of symmetry 30 between the left and right portions of the flux collector 49, 50. In some embodiments, an axis of symmetry 30 can pass through a central portion 24 of the flux collector. In some embodiments, an axis of symmetry 30 can pass through a central portion 24 of the flux collector and between the left and right portions of the flux collector 49, 50. In some embodiments of a flux collector, such as that shown in FIG. 11, one or more of the widths of successive sections of the flux collector (e.g. central portion 24, left and right tapered sections 25L, 25R, left and right outwardly tapering portions 26L, 26R, left and right secondary tapered sections 27L, 27R, left and right tertiary tapered sections 28L, 28R and left and right flux collector tips 29L, 29R) can be the same where the sections connect to one another.

An additional embodiment of a flux collector is shown in FIG. 14-16. Here, the flux collectors 98, 99 are rectangular-shaped and functionally connected at an edge to a bracket 125 which in turn is functionally connected to two magneto sensitive elements 100, 101. In various embodiments, the flux collectors of FIG. 14-16 can be used with any of the flux emitters disclosed herein as well as other magnetic arrangements of flux emitters, and the flux collectors of FIG. 11 can be used with any of the flux emitters disclosed herein as well as other magnetic arrangements of flux emitters.

Signal Response

Figure 12:
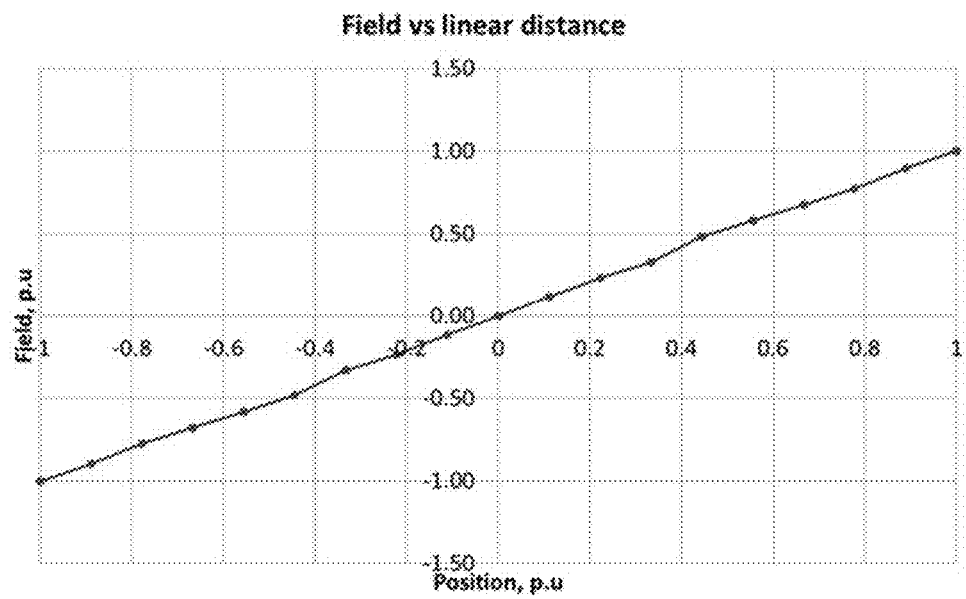
FIG. 12 shows a response curve for an embodiment of a position sensor.
Figure 13:
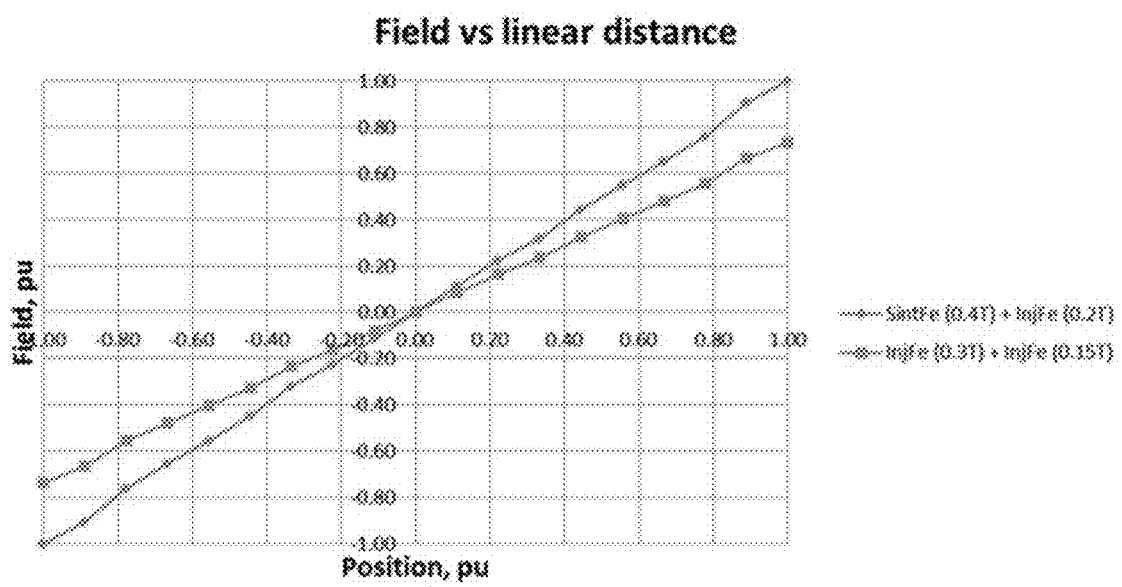
FIG. 13 shows a response curve for an embodiment of a position sensor.

In some embodiments of a position sensor, as disclosed herein, it can be desirable to produce a linear signal for a substantial portion of the range of positions being detected or for the entirety of the range of positions being detected, such as that shown in FIG. 12 or FIG. 13. FIG. 12 shows a signal response curve for an embodiment of a position sensor of a type shown in FIGS. 4-7. The data for FIG. 12 was modeled using Flux 3D from Altair® HyperWorks® (Troy, MI, USA) and is shown below in Table 1.

TABLE 1

| Position, mm | Position, Normalized | Modeled Output, Gauss | Modeled Output, Normalized |
|---|---|---|---|
| −90 | −1.0 | −310 | −1.0 |
| −80 | −0.89 | −280 | −0.90 |
| −70 | −0.78 | −240 | −0.77 |
| −60 | −0.67 | −210 | −0.68 |
| −50 | −0.56 | −180 | −0.58 |
| −40 | −0.44 | −150 | −0.48 |
| −30 | −0.33 | −100 | −0.33 |

TABLE 1-continued

| Position, mm | Position, Normalized | Modeled Output, Gauss | Modeled Output, Normalized |
|---|---|---|---|
| −20 | −0.22 | −73 | −0.23 |
| −10 | −0.11 | −36 | −0.12 |
| 0 | 0.00 | −3.7E−03 | −1.2E−05 |
| 10 | 0.11 | 36 | 0.12 |
| 20 | 0.22 | 73 | 0.23 |
| 30 | 0.33 | 100 | 0.33 |
| 40 | 0.44 | 150 | 0.48 |
| 50 | 0.56 | 180 | 0.58 |
| 60 | 0.67 | 210 | 0.68 |
| 70 | 0.78 | 240 | 0.77 |
| 80 | 0.89 | 280 | 0.90 |
| 90 | 1.0 | 310 | 1.0 |

(Normalized values are the actual value divided by the maximum value.)

The normalized data of Table 1 was fitted by a least-squares analysis to a line passing through the origin. The resulting equation of the line was $Y = 0.9877 X$, where Y is the normalized position and X is the normalized sensor output. However, other methods of fitting the data can be also be used, such as by fitting by a least-squares analysis to a line that is not forced through the origin, and in some embodiments of implementing a linear position sensor, a sensor output can be fitted to a line or a curve that is forced to pass through the origin or not forced to pass through the origin, and in some embodiments where the fitted line or curve does not pass through the origin, the offset from the origin can optionally be compensated for such as by calibrating out the offset from the origin. Table 2 shows the error in the determined position for each measured value, where the position error=(the linear model value of position)−(the position used to calculate the sensor output used in the linear model), and the percent position error=(position error)/(position used to calculate the sensor output used in the linear model.)

The position error and percent position error for a sensor can be calculated as discussed above using a fitted line that is forced through the origin, or it can be calculated by using an alternate fitting, such as a linear fit that is not forced through the origin, or by a non-linear fit that is forced through the origin or not forced through the origin, and can be used to describe a maximum error in the response of a sensor such as a linear position sensor ("error from linearity" or "error from model") for a device by comparing the fitted response or preferably best fit linear response and using the position determined by the sensor for "the linear model value of position" in the equation above, and the actual position for "the position used to calculate the sensor output used in the linear model" in the equation above. The maximum error over the entire position range of Table 2 using a linear fit (forced through the origin or not forced through the origin) is ±6.6%.

TABLE 2

| Sensor Output, normalized | Position Error, normalized | Position Error, percent |
|---|---|---|
| −1.0 | −0.012 | 1.2% |
| −0.90 | −0.0025 | 0.30% |
| −0.77 | −0.016 | 2.1% |
| −0.68 | 0.0023 | −0.30% |
| −0.58 | 0.017 | −3.0% |
| −0.48 | 0.032 | −6.6% |
| −0.33 | −0.0076 | 2.3% |
| −0.23 | 0.0085 | −3.7% |
| −0.12 | 0.0045 | −3.9% |

TABLE 2-continued

| Sensor Output, normalized | Position Error, normalized | Position Error, percent |
|---|---|---|
| −1.2E−05 | 1.2E−05 | |
| 0.12 | −0.0045 | −3.9% |
| 0.23 | −0.0085 | −3.7% |
| 0.33 | 0.0076 | 2.3% |
| 0.48 | −0.032 | −6.6% |
| 0.58 | −0.017 | −3.0% |
| 0.68 | −0.0023 | −0.30% |
| 0.77 | 0.016 | 2.1% |
| 0.90 | 0.0025 | 0.30% |
| 1.0 | 0.012 | 1.2% |

FIG. 13 shows a signal response curve for an embodiment of a position sensor of a type shown in FIGS. 9-10 utilizing a flux emitter made up of multiple discrete magnets separated from one another and the first and second subregions having a there between. In both FIGS. 12 and 13, a substantially linear response is shown with the y-axis being the field strength normalized (signal divided by maximum signal) with 1.0 at maximum and −1.0 at minimum. The x-axis is the position normalized (position divided by extreme position) with 1.0 at one extreme position and −1.0 at the other extreme position. The two curves shown in FIG. 13 corresponds to different strength magnets being used to form the flux emitter with the curve using diamond symbols utilizing sintered ferrite (0.4T) magnets (SinFe designation) close to the distal ends of the first and second subregions and injection molded ferrite (0.2T) magnets (InjFe designation) close to the proximal ends of the first and second subregions. (In practice, any appropriate material can be used for the magnets, such as those disclosed herein.) In FIG. 13, the curve using square symbols was normalized using the maximum signal of the curve utilizing diamond symbols, and utilized in emitter having injection molded ferrite (0.3T) magnets toward the distal ends and injection molded ferrite (0.15T) magnets toward the proximal ends of the first and second subregions. (In practice, any appropriate material can be used for the magnets, such as those disclosed herein.) Accordingly, stronger magnets can be utilized to achieve a stronger signal strength in sensors of the designs shown herein. Further, stronger magnets can be achieved with different magnetic materials were with different sizing and/or shaping of the magnet and/or spacing between the magnet and the sensor.

In some embodiments, however, it can be sufficient to have a constantly increasing or constantly decreasing signal as the position sensor is moved from one extreme position to the other (flux emitter moving in relation to the sensor assembly or vice versa.) In some embodiments a signal can be a combination of linear and nonlinear, constantly increasing or decreasing signal as the position sensor moves from one extreme position to the other, with preferred embodiments providing a unique signal for each position along the entire travel length. However, a response that is linear can be preferred in some embodiments at least because of the ease of determining the position from the signal and the ease of interpolating the position between calibration points. Further, a sensor with a linear response can in some embodiments be implemented with fewer or simpler electronics (such as where position is proportional to signal), easier to calibrate and to maintain.

Figure 17:
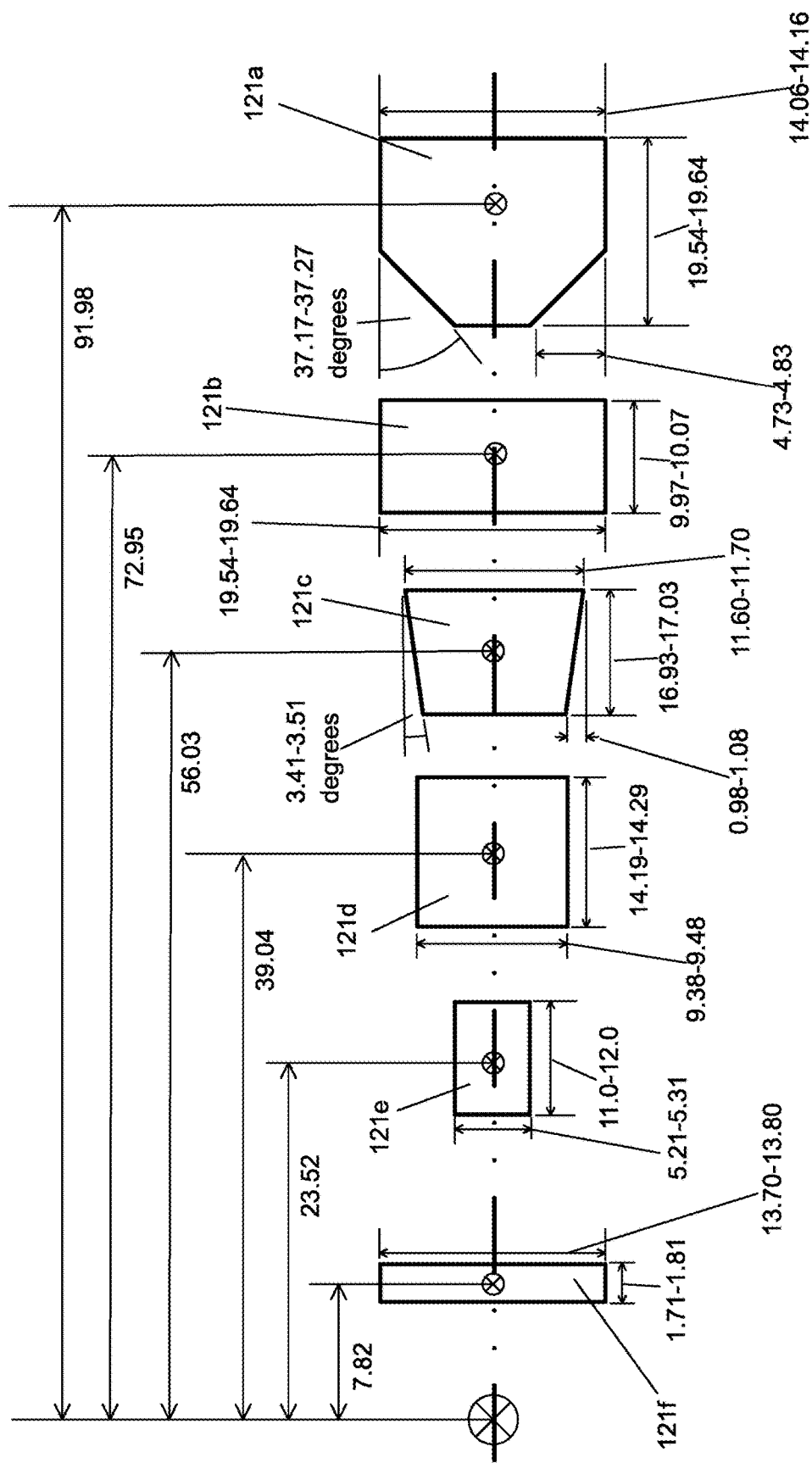
FIG. 17 shows an embodiment of a flux emitter.
Figure 18:
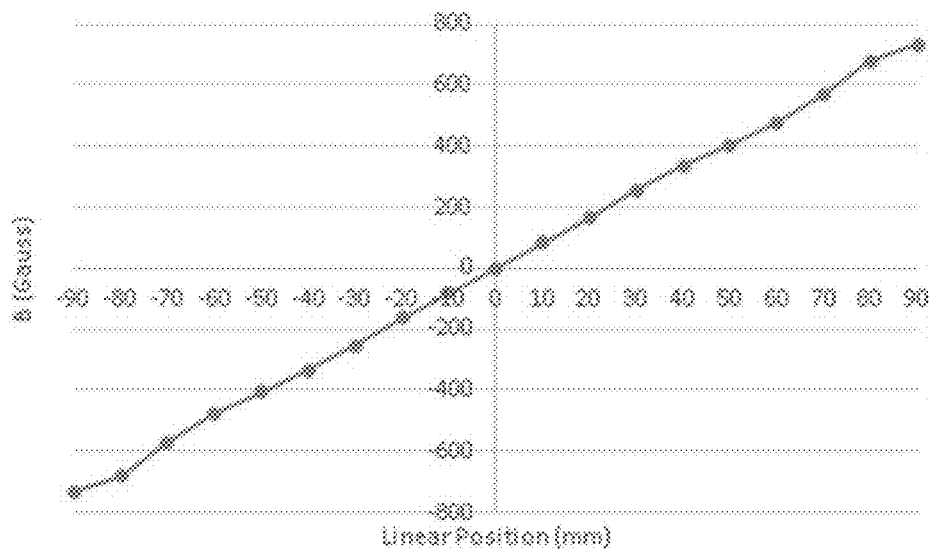
FIG. 18 shows a response curve for an embodiment of a flux emitter.

FIG. 18 is a graph of the modeled signal response of the emitter of FIG. 14 and the flux collector of FIGS. 14-16. The dimensions of the flux emitter are shown in FIG. 17 (all dimensions are in millimeters and degrees.) The small circle-surrounding-x symbol used in FIG. 17 shows the midpoint (length and width) of each individual magnet (121a-f) and the large circle-surrounding-x shows the midpoint of the emitter of FIG. 14 that corresponds to the axis of symmetry 30 and the midline 124 of the width of the individual magnets of the flux emitter as shown in FIG. 14. (The drawings of FIGS. 14-16 are not to scale.)

The individual magnets used in the modeling for FIG. 18 are as shown in Table 1:

TABLE 1

Magnet Characteristics for FIG. 14 and FIG. 17.

| Magnet | Material | Strength | Shape |
|---|---|---|---|
| 121a | Ferrite | 0.4 T | Rectangle + truncated cone |
| 121b | Ferrite | 0.3 T | Wide rectangle |
| 121c | Ferrite | 0.2 T | Isosceles trapezoid |
| 121d | Ferrite | 0.2 T | Long rectangle |
| 121e | Ferrite | 0.2 T | Long rectangle |
| 121f | Ferrite | 0.2 T | Wide rectangle |

The flux collectors are 50/50 NiFe. (In practice, any appropriate material can be used for the flux collectors, such as those disclosed herein.) A flux collector designed to take advantage of these results can have a length, width and thickness of 16.00 mm, 14.02-14.26 mm and 0.95-1.05 mm, respectively.

The shapes of the individual magnets 121a-f can be, as described in Table 1, with the descriptions are for the point of view of looking down on the magnets as in FIG. 14. Heights of magnets are constant within a magnet (or substantially so) and in some embodiments can be the same between magnets or different for different magnets. For the magnets used to produce the response curve of FIG. 18, all of the magnets were 5.0 mm thick. Magnet 121a can have a shape comprising or consisting of a rectangle and a truncated triangle, such as an isosceles triangle, and where the truncation shortens two equal-length sides an equal amount, where the base of the triangle is has the same dimension as the side of the rectangle to which it is attached, thus forming a taper onto the rectangular portion. The orientation can have the truncated portion of the triangle (or the taper) directed at the axis of symmetry of the flux emitter. Magnet 121b can be a wide rectangle where the width dimension is larger than the length dimension. Magnet 121c can be an isosceles trapezoid where the large base is directed away from the axis of symmetry and toward magnet 121b and the small base (parallel to the large base) is directed toward the axis of symmetry and toward magnet 121d. Magnet 121d can be a long rectangle where the length is greater than the width. Magnet 121e can be a long magnet, where the length is greater than the width. Magnet 121f can be a wide magnet where the width is greater than the length. In some embodiments, magnet 121d is larger than magnet 121e. In some embodiments, each successive magnet moving from the proximal end of a subregion to the distal end can be stronger than the previous magnet, accordingly 121a>121b>121c>121d>121e>121f. While Table 1 associates particular magnet shapes with certain magnetic strengths and magnetic materials, any magnetic material (each selected independently) can be used with the shapes presented in Table 1, and the magnet strength of each individual magnetic piece can vary from that shown in Table 1, while maintaining the general characteristic of being constant or increasing from the proximal ends to the distal ends of the subregions.

As can be seen in FIG. 18, the response of the position sensor is very linear, with only minor deviations at the extreme ends of travel. For this embodiment of a position sensor (flux emitter and sensor assembly), the maximum deviation from linearity can be determined as the modeled response at position X minus the linear equation value for position X, where the linear equation is the equation for the line determined by a least squares fit, with the line forced through the origin (although, in practice, a different fitting can also be used, such as a linear equation that is not forced through the origin or a non-linear equation that is forced or is not forced through the origin.)

Figure 19A:
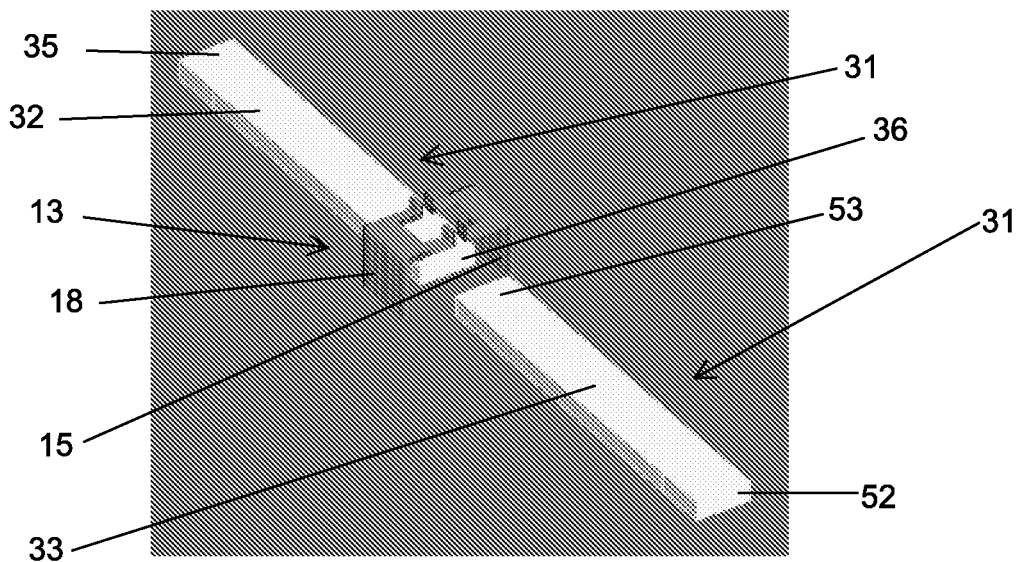
FIG. 19A shows an embodiment of a sensor having a rectangular shaped flux emitter and a rectangular flux emitter
Figure 19B:
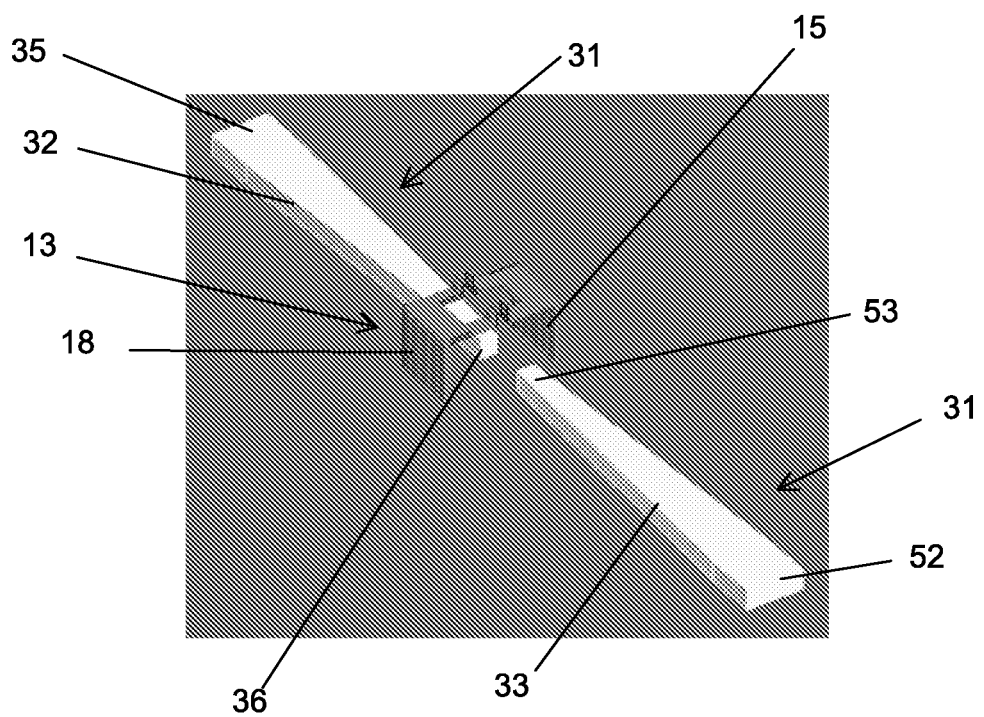
FIG. 19B shows an embodiment of a sensor having a rectangular shaped flux emitter and a tapered flux emitter.
Figure 20:
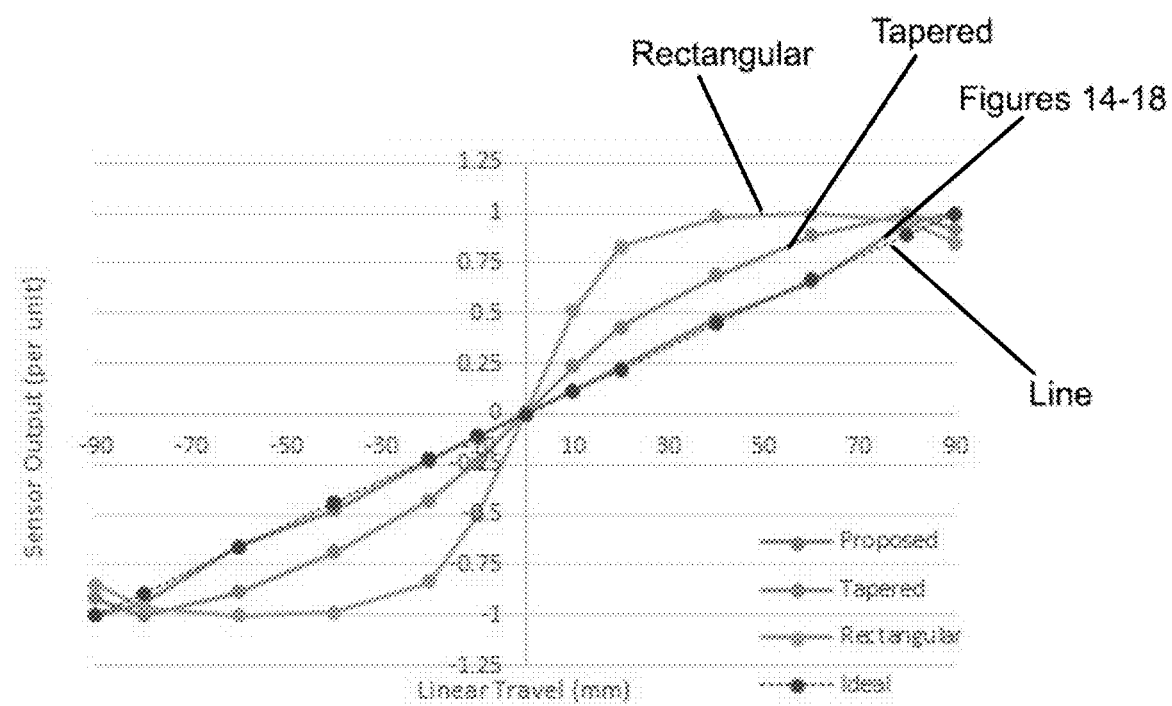
FIG. 20 shows modeled response curves for three different sensors.

FIG. 20 shows the response curve for the sensor depicted in FIGS. 14-17 with response of FIG. 18 as well as the response curves for sensors shown in FIGS. 19A and 19B having rectangular (FIG. 19A) flux emitters 31 and tapered (FIG. 19B) flux emitters 31. In FIG. 19A, each of the first and second magnetic regions 32, 33 are rectangular and in FIG. 19B, each of the first and second magnetic regions 32, 33 are tapered, with the distal end 35 of the first magnetic region 32 being wider than the proximal end 36 of the first magnetic region 32 and the distal end 52 of the second magnetic region 33 being wider than the proximal end 53 of the second magnetic region 33. The same sensor assembly was used for all three versions shown in FIG. 20. As can be seen in FIG. 20, the response curve for the sensor of FIGS. 14-17 is significantly more linear that the sensors shown in FIGS. 19A and 19B.

The linear position sensor, shown in FIGS. 14-17, as well as other linear position sensors disclosed herein can be scaled in size by proportionally increasing the length and width and spacing or the length, width and height and spacing of the individual magnets and the flux collectors. Such as "scaled-up" or "scaled-down" sensor can have a similar or same linearity as the non-scaled version of the sensor. Similarly, the power of the magnets used can be scaled up or down by proportionally increasing or decreasing the strength of all of the magnets together. In addition, position sensors disclosed herein can also be shortened by truncating the flux emitter, and still maintaining the linear/ substantially linear/constantly increasing or decreasing nature of the non-truncated sensor.

Flux Emitter Materials

Embodiments of flux emitters described herein can be of any suitable magnetic material, such as magnetic metals (e.g. iron, iron alloys, cobalt, cobalt alloys, nickel, nickel alloys, gadolinium, gadolinium alloys, dysprosium, dysprosium alloys, etc.), rare-earth magnets (e.g. samarium-cobalt, neodymium, neodymium alloys, neodymium-iron-boron, etc.), composites (e.g. ferrite, ferric oxide, Alnico, etc., by whatever manufacturing method, such as sintering or injection molding and whether or not used with other materials such as binders, plastics, etc.) and the like.

Embodiments of magnetic regions and/or magnetic subregions of such as those disclosed herein can be of a single piece of magnet or can be formed from a plurality of discrete magnets. Embodiments where a series or plurality of discrete or separate magnets are described, except when indicated otherwise by the context, the individual magnets can be separated by a gap, the separate magnets can be affixed to one another or can separated by a non-magnetic material, such as plastic, ceramic, adhesive, non-magnetic metal. In some embodiments, where there are multiple subregions present, one or more subregions can be formed from a plurality of magnets. In some embodiments, all of the subregions can be formed from a plurality of magnets. In some embodiments where a plurality of magnets is used in a subregion, two or more of the individual magnets within the subregion can be in contact with another magnet. In some embodiments where a plurality of magnets is used in a subregion, two or more of the individual magnets within the subregion can be spaced apart from another adjacent magnet. In some embodiments where a plurality of magnets are used in a subregion, all of the individual magnets can be positioned to contact another magnet or can be positioned to be spaced apart from all adjacent magnets. In some embodiments where one subregion is positioned in a lengthwise relationship with another subregion, the two subregions can contact one another. In some embodiments where one subregion is positioned in a lengthwise relationship with another subregion and one or both of the subregions comprise a plurality of separate magnetic pieces, the magnetic piece closest to the other subregion can contact the other subregion or a discrete magnet of the other subregion.

Magneto Sensitive Element

In various embodiments, the magneto sensitive element as used in embodiments of position sensors discussed herein can be any suitable type that will provide a varied signal related to the varied magnetic field strength at the various positions of the position sensor as discussed herein. However, preferred embodiments of a magneto sensitive element include magneto sensitive elements that operate based upon Hall effect, magnetorestriction (MR), giant magnetoresistance (GMR) or tunnel magnetoresistance (TMR). While inductive type magnetic sensors can also be used successfully, in some embodiments sensors that utilize such a principle of operation can be subject to difficulties in placement of the sensor due to proximity of conductive materials (e.g. aluminum, copper, bronze, iron, steel, iron alloys, nickel, nickel alloys, etc.) or ferromagnetic materials (e.g. iron, steel, iron alloys, cobalt, cobalt alloys, nickel, nickel alloys, etc.), such as are common in steering systems and in other portions of automobiles and other vehicles, which can interfere with the sensing of the magnetic field used in the position sensor. Further, in position of a conductive material between the flux emitter and an inductive type magnetic sensor can interfere with sensing the magnetic field of the position sensor, and therefore can result in an inaccurate, false or otherwise problematic signal and determination of position, and other types of sensors can have reduced sensitivity to such issues.

As used herein, the words "approximately", "about", "substantially", "near" and other similar words and phrasings are to be understood by a person of skill in the art as allowing for an amount of variation not substantially affecting the working of the device, example or embodiment. In those situations where further guidance is necessary, the degree of variation should be understood as being 7%.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims.

Concepts

Concept 1. A non-contact linear position sensor comprising:
- a sensor assembly comprising:
    - a first magnetic flux collector having a distal and a proximal end;
    - a second magnetic flux collector having a distal and a proximal end; and
    - a magneto sensitive element positioned between and in operational communication with the respective proximal ends of the first and second magnetic flux collectors to measure the difference in magnetic fields that the first and second flux collectors are exposed to;
- a flux emitter comprising:
    - a first magnetic region having a distal and a proximal end, wherein the distal and proximal ends extend between a north pole face and a south pole face of the first magnetic region;
    - a second magnetic region; and
    - a third magnetic region having a distal and a proximal end, wherein the distal and proximal ends extend between a north pole face and a south pole face of the third magnetic region;
- wherein the second magnetic region is positioned between the respective proximal ends of the first and the third magnetic regions and the second magnetic region has a pole direction opposite to the pole direction of the first magnetic region and opposite to the pole direction of the third magnetic region; and
- the sensor assembly is positioned to detect the magnetic field of the flux emitter in a spaced apart arrangement with the first and second flux collectors extending along the flux emitter, and in a zero position, the sensor assembly measures zero net magnetic field; and
- when the sensor assembly is moved relative to the flux emitter a first distance along the flux emitter in a direction of the first magnetic region, the sensor assembly detects a net positive magnetic field, and when the sensor assembly is moved relative to the flux emitter the first distance along the flux emitter in a direction of the third magnetic region, the sensor assembly detects a net negative magnetic field; and
- as the flux emitter is moved relative to the sensor assembly to a position where the distal end of the first flux collector corresponds to the distal end of the first magnetic region, the sensor assembly measures a continuously increasing net positive magnetic field, and as the flux emitter is moved relative to the sensor assembly to a position where the distal end of the second flux collector corresponds to the distal end of the third magnetic region, the sensor assembly measures a continuously decreasing net negative magnetic field.

Concept 2. The sensor of Concept 1, wherein a distance between the proximal and distal ends of the first magnetic region is equal to a distance between the proximal and distal ends of the third magnetic region.

Concept 3. The sensor of Concept 2, wherein the distance between the proximal end of the first magnetic region and the proximal end of the third magnetic region is approximately twice the distance between the proximal and distal ends of the first magnetic region.

Concept 4. The sensor of Concept 3, wherein each of the first and third magnetic regions have approximately constant magnetic fields between the respective proximal and distal ends and the second magnetic region has an approximately constant magnetic field over an end proximal the proximal end of the first magnetic region to an end proximal the proximal end of the third magnetic region.

Concept 5. The sensor of Concept 4, wherein a distance between the proximal and distal ends of the first flux collector is approximately equal to a distance between the proximal and distal ends of the second flux collector.

Concept 6. The sensor of Concept 5, wherein at the zero position, the sensor assembly is centered between the distal end of the first magnetic region and the distal end of the third magnetic region.

Concept 7. The sensor of Concept 6, wherein the distance between the proximal and distal ends of the first flux collector is approximately equal to the distance between the proximal and distal ends of the first magnetic region.

Concept 8. A steering system for a vehicle comprising the sensor of Concept 7, wherein the sensor is configured and located to transmit a signal related to the position of a steering wheel, a steering command or a turning position of a wheel in contact with a road.

Concept 9. The position sensor of Concept 1, wherein the first flux collector comprises:
- a rectangular central portion in operational communication with the magneto sensitive element;
- left and right tapered portions attached to the rectangular central portion and tapering to a smaller width as the distance from the rectangular central portion increases;
- left and right outwardly tapered sections connected to the respective left and right tapered portions and tapering to a greater width as the distance from the respective left and right tapered portions increases;
- left and right secondary tapered sections connected to the respective left and right outwardly tapered sections and tapering to a smaller width as the distance from the respective left and right outwardly tapered portions increases;
- left and right tertiary tapered sections connected to the respective left and right secondary tapered sections and tapering to a smaller width as the distance from the respective left and right secondary tapered sections increases; and
- left and right flux collector tips having a rectangular shape connected to the respective left and right tertiary tapered sections.

Concept 10. The position sensor of Concept 9, wherein the first flux collector is dimensioned as follows:
- the central portion and respective left and right tapered sections having the same width where they connect to one another;

the left and right tapered sections and respective left and right outwardly tapered sections having the same width where they connect to one another;

the left and right outwardly tapered sections and the respective left and right secondary tapered sections having the same width where they connect to one another;

the left and right secondary tapered sections and respective left and right tertiary tapered sections having the same width where they connect to one another;

the left and right tertiary tapered sections and the respective left and right collector tips having the same width where they connect to one another.

Concept 11. The position sensor of Concept 10, wherein the first flux collector has an axis of symmetry through the central portion.

Concept 12. A non-contact linear position sensor comprising:

an flux emitter comprising a magnet array, the magnet array being mountable on a surface, the magnet array comprising:

a first magnetic region comprising a first and a second subregion, each of the first and second subregions of the first magnetic region emitting a magnetic field, wherein the first and second subregions of the first magnetic region having respective distal and proximal ends extending between respective north and south poles and respective magnetic axes extending between the respective north and south poles, the magnetic axis of the first subregion of the first magnetic region being directed in a direction opposite to the magnetic axis of the second subregion of the first magnetic region, and the proximal ends of the first and second subregions of the first magnetic region being adjacent to one another;

a second magnetic region comprising a first and a second subregion, each of the first and second subregions of the second magnetic region emitting a magnetic field, wherein the first and second subregions of the second magnetic region having respective distal and proximal ends extending between respective north and south poles and respective magnetic axes extending between the respective north and south poles, the magnetic axis of the first subregion of the second magnetic region being directed in a direction opposite to the magnetic axis of the second subregion of the second magnetic region, and the proximal ends of the first and second subregions of the second magnetic region being adjacent to one another;

wherein, the magnetic axes of each of the first and second subregions of the first magnetic region and the first and second subregions of the second magnetic region extend outward from the surface when the magnet array is mounted on the surface for use;

a sensor assembly comprising:
 a first magnetic flux collector;
 a second magnetic flux collector; and
 a magneto sensitive element positioned between and in operational communication with the first and the second magnetic flux collectors to measure the difference in magnetic fields that the first and second flux collectors are exposed to;

wherein, when in operation, the first magnetic flux collector is positioned over the first magnetic region and the second flux collector is positioned over the second magnetic region, and as the distal end of the first subregion of the first magnetic region moves relative to the first flux collector toward the first flux collector, and the distal end of the first subregion of the second magnetic region moves relative to the second flux collector toward the second flux collector, the sensor assembly measures a continuously increasing or a continuously decreasing magnetic field.

Concept 13. The position sensor of Concept 12, wherein at least one of the magnetic fields emitted by the first and second subregions of the first and second magnetic regions of the flux emitter increase in strength from the proximal end to the distal end.

Concept 14. The position sensor of Concept 13, wherein at least one of the first and second subregions of the first and second magnetic regions comprises a series of discrete magnets separated from one another.

Concept 15. The position sensor of Concept 12, wherein each of the magnetic fields emitted by the first and second subregions of the first and second magnetic regions of the flux emitter is substantially the same.

Concept 16. The position sensor of Concept 12, wherein the first flux collector comprises:

a rectangular central portion in operational communication with the magneto sensitive element;

left and right tapered portions attached to the rectangular central portion and tapering to a smaller width as the distance from the rectangular central portion increases;

left and right outwardly tapered sections connected to the respective left and right tapered portions and tapering to a greater width as the distance from the respective left and right tapered portions increases;

left and right secondary tapered sections connected to the respective left and right outwardly tapered sections and tapering to a smaller width as the distance from the respective left and right outwardly tapered portions increases;

left and right tertiary tapered sections connected to the respective left and right secondary tapered sections and tapering to a smaller width as the distance from the respective left and right secondary tapered sections increases; and left and right flux collector tips having a rectangular shape connected to the respective left and right tertiary tapered sections.

Concept 17. The position sensor of Concept 16, wherein the first flux collector is dimensioned as follows:

the central portion and respective left and right tapered sections having the same width where they connect to one another;

the left and right tapered sections and respective left and right outwardly tapered sections having the same width where they connect to one another;

the left and right outwardly tapered sections and the respective left and right secondary tapered sections having the same width where they connect to one another;

the left and right secondary tapered sections and respective left and right tertiary tapered sections having the same width where they connect to one another;

the left and right tertiary tapered sections and the respective left and right collector tips having the same width where they connect to one another.

Concept 18. The position sensor of Concept 17, wherein the first flux collector has an axis of symmetry through the central portion.

Concept 19. A steering system for a vehicle comprising the sensor of Concept 12, wherein the sensor is configured and located to transmit a signal related to the position of a steering wheel, a steering command or a turning position of a wheel in contact with a road.

Concept 20. A non-contact linear position sensor comprising:
- a flux emitter comprising a magnet array, the magnet array being mountable on a surface, the magnet array comprising:
  - a first magnetic region comprising a first and a second subregion, wherein
    - the first and second subregions of the first magnetic region having respective distal and proximal ends extending between respective north and south pole faces and respective magnetic axes extending between the respective north and south pole faces,
    - the magnetic axis of the first subregion of the first magnetic region being directed in a direction opposite to the magnetic axis of the second subregion of the first magnetic region, and
    - the proximal ends of the first and second subregions of the first magnetic region being adjacent to one another;
  - wherein, the magnetic axes of each of the first and second subregions of the first magnetic region extend parallel to the surface when the magnet array is mounted on the surface for use;
- a sensor assembly comprising:
  - a first magnetic flux collector;
  - a second magnetic flux collector; and
  - a magneto sensitive element positioned between and in operational communication with the first and the second magnetic flux collectors to measure the magnetic fields that the first and second flux collectors are exposed to;
  - wherein, when in operation, the flux emitter moves relative to the first magnetic flux collector in a spaced apart manner with the north face of the first subregion and the south face of the second subregion moving relative to the second magnetic flux collector in a spaced apart manner with the south face of the first subregion and the north face of the second subregion of the first magnetic region,
  - and as the distal end of the first magnetic region moves relative to the first and second flux collectors toward the first and second flux collectors, the sensor assembly measures a continuously increasing or a continuously decreasing magnetic field.

Concept 21. The position sensor of Concept 20, wherein at least one of the magnetic fields emitted by the first and second subregions of the first magnetic region of the flux emitter increase in strength from the proximal end to the distal end.

Concept 22. The position sensor of Concept 21, wherein at least one of the first and second subregions of the first magnetic region comprise a series of discrete magnets separated from one another.

Concept 23. The position sensor of Concept 20, wherein each of the magnetic fields emitted by the first and second subregions of the first magnetic regions of the flux emitter is substantially the same.

Concept 24. The position sensor of Concept 20, wherein the first flux collector comprises:
- a rectangular central portion in operational communication with the magneto sensitive element;
- left and right tapered portions attached to the rectangular central portion and tapering to a smaller width as the distance from the rectangular central portion increases;
- left and right outwardly tapered sections connected to the respective left and right tapered portions and tapering to a greater width as the distance from the respective left and right tapered portions increases;
- left and right secondary tapered sections connected to the respective left and right outwardly tapered sections and tapering to a smaller width as the distance from the respective left and right outwardly tapered portions increases;
- left and right tertiary tapered sections connected to the respective left and right secondary tapered sections and tapering to a smaller width as the distance from the respective left and right secondary tapered sections increases; and
- left and right flux collector tips having a rectangular shape connected to the respective left and right tertiary tapered sections.

Concept 25. The position sensor of Concept 24, wherein the first flux collector is dimensioned as follows:
- the central portion and respective left and right tapered sections having the same width where they connect to one another;
- the left and right tapered sections and respective left and right outwardly tapered sections having the same width where they connect to one another;
- the left and right outwardly tapered sections and the respective left and right secondary tapered sections having the same width where they connect to one another;
- the left and right secondary tapered sections and respective left and right tertiary tapered sections having the same width where they connect to one another;
- the left and right tertiary tapered sections and the respective left and right collector tips having the same width where they connect to one another.

Concept 26. The position sensor of Concept 25, wherein the first flux collector has an axis of symmetry through the central portion.

Concept 27. The sensor of Concept 20, wherein the first subregion of the first magnetic region comprises a first plurality of magnets separated from one another by gaps, each of the first plurality of magnets having a respective north face and a respective south face and a respective magnetic axis extending therebetween, and each of the respective magnetic axes of the first plurality of magnets being aligned in the same direction and a magnetic field generated by the first plurality of magnets continuously increasing from the proximal end of the first subregion to the distal end of the first subregion.

Concept 28. The sensor of Concept 27, wherein the second subregion of the first magnetic region comprises a second plurality of magnets separated from one another by gaps, each of the second plurality of magnets having a respective north face and a respective south face and a respective magnetic axis extending therebetween, and each of the respective magnetic axes of the second plurality of magnets being aligned in the same direction and a magnetic field generated by the second plurality of magnets continuously increasing [on average?] from the proximal end of the first subregion to the distal end of the second subregion.

Concept 29. The sensor of Concept 28, wherein the first and second plurality of magnets each comprise: a first magnet having a shape of a rectangle where a width is greater than a length; a second magnet next to the first magnet having a shape of a rectangle where a length is greater than a width; a third magnet next to the second magnet having a shape of a rectangle where a length is greater than a width; a fourth magnet next to the third magnet having a shape of an isosceles trapezoid where a large base is directed toward a fifth magnet and a small base is directed toward the third magnet; the fifth magnet next to the fourth magnet having a shape of a rectangle where a width is greater than a length; and a sixth magnet next to the fifth magnet having a shape comprising a rectangle and a truncated isosceles triangle, wherein a base of the triangle has a same dimension as a side of the rectangle to which the triangle is attached to form a taper onto the rectangle, where the taper is directed toward the fifth magnet, wherein the first magnet of the first plurality of magnets is located next to and spaced apart from the first magnet of the second plurality of magnets.

Concept 30. The sensor of Concept 29, wherein a maximum error from linearity for the sensor is ±6.6%.

Concept 31. A steering system for a vehicle comprising the sensor of Concept 20, wherein the sensor is configured and located to transmit a signal related to the position of a steering wheel, a steering command or a turning position of a wheel in contact with a road.

The invention claimed is:

1. A non-contact linear position sensor comprising:
a flux emitter comprising a magnet array, the magnet array comprising:
a first magnetic region comprising a first and a second subregion, wherein
the first and second subregions of the first magnetic region having respective distal and proximal ends extending between respective north and south pole faces and respective magnetic axes extending between the respective north and south pole faces,
the magnetic axis of the first subregion of the first magnetic region being directed in a direction opposite to the magnetic axis of the second subregion of the first magnetic region,
the proximal ends of the first and second subregions of the first magnetic region being adjacent to one another, and
the first subregion of the first magnetic region comprises a first plurality of magnets separated from one another by gaps, and a shape of one of the first plurality of magnets, which has a width shorter than a length, in the first subregion is different from a shape of another of the first plurality of magnets, which has a width longer than a length, in the first subregion such that a magnetic field generated by the first plurality of magnets continuously increasing from the proximal end of the first subregion to the distal end of the first subregion;
wherein, the magnetic axes of each of the first and second subregions of the first magnetic region extend parallel to a surface when the magnet array is mounted on the surface for use;
a sensor assembly comprising:
a first magnetic flux collector;
a second magnetic flux collector; and
a magneto sensitive element positioned between and in operational communication with the first and the second magnetic flux collectors to measure the magnetic fields that the first and second flux collectors are exposed to;
wherein, when in operation, the flux emitter moves relative to the first magnetic flux collector in a spaced apart manner with the north face of the first subregion and the south face of the second subregion moving relative to the second magnetic flux collector in a spaced apart manner with the south face of the first subregion and the north face of the second subregion of the first magnetic region, and
as the distal end of the first magnetic region moves relative to the first and second flux collectors toward the first and second flux collectors, the sensor assembly measures a continuously increasing or a continuously decreasing magnetic field.

2. The position sensor of claim 1, wherein at least one of the magnetic fields emitted by the first and second subregions of the first magnetic region of the flux emitter increase in strength from the proximal end to the distal end.

3. The position sensor of claim 1, wherein each of the magnetic fields emitted by the first and second subregions of the first magnetic regions of the flux emitter is substantially the same.

4. The position sensor of claim 1, wherein the first flux collector comprises:
left and right collector tips narrower than a rectangular central portion of the first flux collector.

5. The position sensor of claim 4, wherein the first flux collector comprises:
the rectangular central portion in operational communication with the magneto sensitive element;
left and right tapered portions attached to the rectangular central portion and tapering to a smaller width as the distance from the rectangular central portion increases;
left and right outwardly tapered sections connected to the respective left and right tapered portions and tapering to a greater width as the distance from the respective left and right tapered portions increases;
left and right secondary tapered sections connected to the respective left and right outwardly tapered sections and tapering to a smaller width as the distance from the respective left and right outwardly tapered portions increases; and
left and right tertiary tapered sections connected to the respective left and right secondary tapered sections and tapering to a smaller width as the distance from the respective left and right secondary tapered sections increases,
wherein the left and right flux collector tips have a rectangular shape connected to the respective left and right tertiary tapered sections, and
wherein the first flux collector is dimensioned as follows:
the central portion and respective left and right tapered sections having the same width where they connect to one another;
the left and right tapered sections and respective left and right outwardly tapered sections having the same width where they connect to one another;
the left and right outwardly tapered sections and the respective left and right secondary tapered sections having the same width where they connect to one another;
the left and right secondary tapered sections and respective left and right tertiary tapered sections having the same width where they connect to one another; and the left and right tertiary tapered sections and the respective left and right collector tips having the same width where they connect to one another.

6. The position sensor of claim 5, wherein the first flux collector has an axis of symmetry through the central portion.

7. The sensor of claim 1, wherein each of the first plurality of magnets having a respective north face and a respective south face and a respective magnetic axis extending therebetween, and each of the respective magnetic axes of the first plurality of magnets being aligned in the same direction.

8. The sensor of claim 7, wherein the second subregion of the first magnetic region comprises a second plurality of magnets separated from one another by gaps, each of the second plurality of magnets having a respective north face and a respective south face and a respective magnetic axis extending therebetween, and each of the respective magnetic axes of the second plurality of magnets being aligned in the same direction and a magnetic field generated by the second plurality of magnets continuously increasing from the proximal end of the first subregion to the distal end of the second subregion.

9. The sensor of claim 8, wherein the first and second plurality of magnets each comprise: a first magnet having a shape of a rectangle where a width is greater than a length; a second magnet next to the first magnet having a shape of a rectangle where a length is greater than a width; a third magnet next to the second magnet having a shape of a rectangle where a length is greater than a width; a fourth magnet next to the third magnet having a shape of an isosceles trapezoid where a large base is directed toward a fifth magnet and a small base is directed toward the third magnet; the fifth magnet next to the fourth magnet having a shape of a rectangle where a width is greater than a length; and a sixth magnet next to the fifth magnet having a shape comprising a rectangle and a truncated isosceles triangle, wherein a base of the triangle has a same dimension as a side of the rectangle to which the triangle is attached to form a taper onto the rectangle, where the taper is directed toward the fifth magnet, wherein the first magnet of the first plurality of magnets is located next to and spaced apart from the first magnet of the second plurality of magnets.

10. A steering system for a vehicle comprising the sensor of claim 1, wherein the sensor is configured and located to transmit a signal related to a position of a steering wheel, a steering command or a turning position of a wheel in contact with a road.

* * * * *